(12) United States Patent
Miya et al.

(10) Patent No.: US 8,519,332 B2
(45) Date of Patent: Aug. 27, 2013

(54) SEMICONDUCTOR INSPECTING APPARATUS

(75) Inventors: Go Miya, Hachioji (JP); Seiichiro Kanno, Iwaki (JP); Hiroyuki Kitsunai, Kasumigaura (JP); Masaru Matsushima, Hitachinaka (JP); Toru Shuto, Naka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/537,463

(22) Filed: Jun. 29, 2012

(65) Prior Publication Data
US 2012/0261589 A1 Oct. 18, 2012

Related U.S. Application Data

(63) Continuation of application No. 13/000,461, filed as application No. PCT/JP2009/002860 on Jun. 23, 2009, now Pat. No. 8,232,522.

(30) Foreign Application Priority Data

Jun. 25, 2008 (JP) ................................. 2008-165757

(51) Int. Cl.
*H01J 37/20* (2006.01)
(52) U.S. Cl.
CPC ..................................... *H01J 37/20* (2013.01)
USPC ...................................... 250/306; 250/442.11
(58) Field of Classification Search
USPC .............................. 250/306, 307, 310, 442.11
See application file for complete search history.

(56) References Cited

U.S. PATENT DOCUMENTS

| 5,912,468 | A | 6/1999 | Hirano et al. |
|---|---|---|---|
| 6,903,338 | B2 | 6/2005 | Mankos et al. |
| 7,508,646 | B2 | 3/2009 | Emoto et al. |
| 7,741,601 | B2 * | 6/2010 | Noji et al. ..................... 250/310 |
| 2003/0111616 | A1 | 6/2003 | Suzuki et al. |
| 2006/0126261 | A1 | 6/2006 | Petrov et al. |

FOREIGN PATENT DOCUMENTS

| JP | 6-104164 A | 4/1994 |
|---|---|---|
| JP | 2000-149845 A | 5/2000 |
| JP | 2001-052642 A | 2/2001 |
| JP | 2004-14251 A | 1/2004 |
| JP | 2004-235149 A | 8/2004 |
| JP | 2006-186223 A | 7/2006 |
| JP | 3927012 B2 | 3/2007 |
| JP | 2007-189238 A | 7/2007 |

* cited by examiner

*Primary Examiner* — Kiet T Nguyen
(74) *Attorney, Agent, or Firm* — Mattingly & Malur, PC

(57) ABSTRACT

In the case of inspecting samples having different sizes by means of a semiconductor inspecting apparatus, a primary electron beam bends since distribution is disturbed on an equipotential surface at the vicinity of the sample at the time of inspecting vicinities of the sample, and what is called a positional shift is generated. A potential correcting electrode is arranged outside the sample and at a position lower than the sample lower surface, and a potential lower than that of the sample is applied. Furthermore, a voltage to be applied to the potential correcting electrode is controlled corresponding to a distance between the inspecting position and a sample outer end, sample thickness and irradiation conditions of the primary electron beam.

15 Claims, 20 Drawing Sheets

(A): CASE WHERE SAMPLE 10 IS 300mm-DIAMETER SEMICONDUCTOR WAFER (B): CASE WHERE SAMPLE 10 IS 450mm-DIAMETER SEMICONDUCTOR WAFER

CROSS-SECTIONAL VIEW OF A-A (A): RELATIONSHIP BETWEEN VOLTAGE FROM DC POWER SUPPLY 48 AND SKEW AMOUNT OF PRIMARY ELECTRON BEAM 22

(B): RELATIONSHIP BETWEEN DISTANCE FROM OUTER EDGE OF SAMPLE 10 OF OBSERVATION POSITION AND OPTIMAL VOLTAGE FROM DC POWER SUPPLY 48

(A): CASE WHERE SAMPLE 10 IS 300mm-DIAMETER SEMICONDUCTOR WAFER (B): CASE WHERE SAMPLE 10 IS 450mm-DIAMETER SEMICONDUCTOR WAFER (A): CASE WHERE SAMPLE 10 IS 300mm-DIAMETER SEMICONDUCTOR WAFER (B): CASE WHERE SAMPLE 10 IS 450mm-DIAMETER SEMICONDUCTOR WAFER (A): CASE WHERE SAMPLE 10 IS 300mm-DIAMETER SEMICONDUCTOR WAFER (B): CASE WHERE SAMPLE 10 IS 450mm-DIAMETER SEMICONDUCTOR WAFER (A): CASE WHERE SAMPLE 10 IS 300mm-DIAMETER SEMICONDUCTOR WAFER (B): CASE WHERE SAMPLE 10 IS 450mm-DIAMETER SEMICONDUCTOR WAFER (A): CASE WHERE SAMPLE 10 IS 300mm-DIAMETER SEMICONDUCTOR WAFER (B): CASE WHERE SAMPLE 10 IS 450mm-DIAMETER SEMICONDUCTOR WAFER (A): RELATIONSHIP AMONG PROTRUSION AMOUNT DR1, DISTANCE X, RADIUS R1 IN HOLE, SKEW AMOUNT (B): RELATIONSHIP AMONG PROTRUSION AMOUNT DR1, DISTANCE X, RADIUS R1 IN HOLE, SKEW AMOUNT (A): CASE WHERE SAMPLE 10 IS 300mm-DIAMETER SEMICONDUCTOR WAFER (B): CASE WHERE SAMPLE 10 IS 450mm-DIAMETER SEMICONDUCTOR WAFER (A): CASE WHERE SAMPLE 10 IS 300mm-DIAMETER SEMICONDUCTOR WAFER (B): CASE WHERE SAMPLE 10 IS 450mm-DIAMETER SEMICONDUCTOR WAFER

CROSS-SECTIONAL VIEW OF C-C

SEMICONDUCTOR INSPECTING APPARATUS

This application is a continuation of U.S. patent application Ser. No. 13/000,461, filed Dec. 21, 2010, which is a 371 of international Application No. PCT/JP2009/002860, filed Jun. 23, 2009, and which claims priority to Japanese Application No. 2008-165757, filed Jun. 25, 2008.

TECHNICAL FIELD

The present invention relates to a semiconductor inspecting apparatus using a charged particle beam used for manufacturing a semiconductor device.

BACKGROUND ART

In order to measure a dimension of contact holes between wiring layers or gate electrodes in manufacturing a semiconductor device, an inspecting apparatus using a primary electron beam such as a critical-dimension scanning electron microscope (hereinafter, referred to as a CD-SEM) has been used as one type of charged particle beam application apparatuses.

Herein, FIG. 14 schematically shows an electron optical system of an SEM semiconductor inspecting apparatus used in the related art.

A primary electron beam 22 (shown by a dotted line) from an electron gun 1 by a voltage from an extraction electrode 2 is converged and deflected by passing through a condenser lens 3, a scanning deflector 5, an aperture 6, an objective lens 9, or the like, and is then irradiated at an inspecting position of a sample 10, i.e., a semiconductor device, etc. In addition, the condenser lens 3, the scanning deflector 5, the aperture 6, the objective lens 9, and a shield electrode 16 are formed in an axial symmetry shape based on an optical axis 18 as a central axis.

The sample 10 is applied with a deceleration voltage (hereinafter, referred to as a retarding voltage) from a retarding power supply 26 for decelerating the primary electron beam 22. A secondary electron beam 24 (shown by a dotted line) is generated from the sample 10 by irradiating the primary electron beam 22 and is accelerated by the retarding voltage applied to the sample 10 to be moved upward. The accelerated secondary electron beam 24 is deflected by an E cross B deflector 8 and is then input to a secondary electron detector 14. The secondary electron detector 14 converts the input secondary electron beam 24 into an electric signal, which is in turn amplified by a pre-amp (not shown) to a luminance modulating input for an inspection image signal, thereby obtaining an image data of an inspection region.

In manufacturing the semiconductor device, the sample 10 is a semiconductor wafer and plural rectangular chips are formed almost over the whole region of the sample 10. For this reason, the inspecting apparatus may perform the inspection on the chip at the central portion of the sample 10 as well as the chip formed at the peripheral portion. In the case of inspecting portions (for example, central portion) other than the outer peripheral portion of the sample 10, a equipotential surface of the vicinity of the sample 10 has an axial symmetry distribution using the optical axis 18 as the central axis, but in the case of inspecting the outer peripheral portion of the sample 10, there is a problem in that the axial symmetry of the equipotential surface 20 (shown by a dotted line) of the vicinity of the sample 10 is disordered as shown in FIG. 15. When the axial symmetry of the equipotential surface 20 is disordered, there is a problem in that the case in which the primary electron beam 22 is bent and the primary electron beam 22 arrives at a position 30 spaced apart from a position (a position where the optical axis 18 and the surface of the sample 10 intersects with each other) to be originally inspected on the sample 10, that is, a so-called, a position deviation occurs.

In the CD-SEM, the positions to be measured are detected by performing an approximate position adjustment using a mechanical stage and then, a high-precision position adjustment using the SEM phase. However, when the position deviation is large, the movement amount to the positions to be measured is increased since the position adjusted by using the mechanical stage and the position adjusted by using the SEM phase are far away from each other, thereby causing the degradation in throughput.

The diameter of the semiconductor wafer that is sample is increased, like a diameter of 300 mm or 450 mm. When the diameter of the semiconductor wafer is increased, the curvature in the outer edge thereof is small, such that it is possible to form rectangular device chips formed on the wafer to be further approximate to the outer edge of the semiconductor wafer than before. Accordingly, there is a need to inspect the outer edge as maximally as possible, than before, in manufacturing the semiconductor device. It is known that the above-mentioned position deviation amount is increased as the position to be inspected is at the outer edge of the semiconductor wafer. The problem of the position deviation that causes the bending of the primary electron beam is considered as a more important matter.

As a technology for preventing the disorder of the axial symmetry of the equipotential surface 20 at the outer peripheral portion of the sample, a technology of installing a conductive ring between an edge of the sample (herein, a substrate) and a substrate holder formed at the same height as the surface of the substrate that is the sample and applying voltage to the conductive ring is disclosed in Patent Document 1. Further, the technology controls the voltage applied to the conductive ring according to the gap size between the substrate edge and the substrate holder. It is possible to prevent the potential distribution from being disordered near the substrate by adopting the technology.

Prior Art Documents
Patent Document
Patent Document 1: Japanese Patent Application Laid-Open Publication No. 2004-235149

DISCLOSURE OF THE INVENTION

Problem to be Solved by the Invention

However, some dimensional errors are inevitable during the manufacturing of the substrate holder, such that there is ruggedness or waviness on the surface of the substrate holder. In addition, when the substrate holder is installed in the stage by a bolt, or the like, the substrate holder is deformed to the tightened degree. Likewise, there is a probability of causing the ruggedness or the waviness on the surface. These cause the difference between the surface height of the substrate and the surface height of the substrate holder according to the inspection positions (for example, a position at 12 o'clock and a position at 3 o'clock) of the substrate edge. In this case, even though the voltage applied to the conductive ring is controlled according to the gap size between the substrate edge and the substrate holder, the disorder of the potential distribution near the substrate cannot be completely corrected. In addition, since the dimensional errors of the plural substrate holders are also inevitable, the difference between the surface height of the substrate according to the observation position of the substrate edge and the surface height of the substrate holder occurs by the individual difference of the substrate holder.

As a result, when comparing the plural inspecting apparatuses, the difference in the disorder of the potential distribution near the substrate occurs, such that there is a probability of causing the individual difference of the inspecting apparatus (the difference between the apparatuses). In addition, there may be a case of inspecting various samples, for example, the bent semiconductor substrate as the sample during the semiconductor manufacturing. Even in the case, likewise the above-mentioned case, since the difference in the surface height of the substrate at the edge occurs according to the inspection position (for example, a position at 12 o'clock and a position at 3 o'clock), the disorder of the potential distribution near the substrate cannot be completely corrected even though the voltage applied to the conductive ring is controlled according to the gap size between the substrate edge and the substrate holder.

In addition, when carrying the substrate in order to be installed on the substrate holder, it is likely to contact the substrate to the conductive ring if it is determined that the carrying fails. In this case, it is likely to cause the defects on the electronic devices by damaging the substrate or generating particles by the contacting to be attached to the substrate.

In addition, it is difficult to cope with the inspection of the sample having different sizes in the inspection apparatus described in Patent Document 1. The semiconductor wafer is processed in the manufacturing line of the semiconductor device and inspects it as a sample. However, there may be a case of inspecting a wafer having different sample size such as a diameter of 200 mm (hereinafter, referred to as $\phi200$), a diameter of 300 mm (hereinafter, referred to as $\phi300$) or a large diameter of 450 mm (hereinafter, referred to as $\phi450$).

In this case, in the apparatus described in Patent Document 1, since the surface of the conductive ring installed at the outside of the sample is formed at the same height as the surface of the sample, i.e., the substrate, it is difficult to cope with the inspection of the sample having different diameters. For example, when the wafer of $\phi450$ is put on the sample stage installed with the conductive ring for the wafer of $\phi300$, the wafer of $\phi450$ is interfered with the conductive ring such that it cannot be put on the sample stage, since the surface of the conductive ring is the same height as the wafer of $\phi300$. In this case, in the apparatus described in Patent Document 1, there is a need to previously prepare two kinds of conductive rings suitable for each semiconductor wafer and exchange them with each other. For example, when the wafer, i.e. the sample of $\phi450$ is measured after inspecting the wafer of $\phi300$, there is a problem in that the sample carrying mechanism of the inspection apparatus is complicated since the conductive ring for the wafer of $\phi300$ to the conductive ring for the wafer of $\phi450$ are installed to be exchanged with each other.

An object of the present invention is to provide a semiconductor inspecting apparatus capable of preventing a position deviation occurring at an outer peripheral portion thereof when inspecting an outer peripheral portion of a semiconductor wafer sample.

Means for Solving the Problems

To achieve the above objects, the present invention provides a semiconductor inspecting apparatus including a sample stage having a sample is held thereon, a unit moving the sample stage, a beam source irradiating a charged particle beam to the surface of the sample, a beam scanning unit scanning the charged particle beam to the surface of the sample, the apparatus including: a first electrode at an outside from the outer edge of the sample having a first size and an inside from the outer edge of the sample having a second size and at a position lower than the bottom surface of the sample wherein the sample stage holds the sample in a first size and the sample in a second size larger than the first size; a second electrode at an outside from the outer edge of the sample having a second size; a first voltage supply source applying voltage to a first electrode or the second electrode; an analyzer analyzing the voltage of the voltage supply source according to an inspecting position of the sample, a thickness of the sample and an irradiating condition of the charged particle beam, and a controller controlling the voltage of the voltage supply source based on an analysis result of the analyzer.

Preferably, the present invention provides a semiconductor inspecting apparatus, wherein the sample stage holds the sample in a first size and the sample in a second size larger than the first size and a surface of the sample stage is made of dielectric, the apparatus including: a first electrode installed within the dielectric and at an inside from the outer edge of the sample in a first size; a second electrode installed within the dielectric and at an outside of the first electrode and having an inner edge installed at an inside from an outer edge of the sample in a first size and an outer edge installed at an outside from the outer edge of the sample in a first size; a third electrode installed within the dielectric, at an outside of the second electrode and at an inside from an outer edge of the sample in a second size; a fourth electrode installed within the dielectric and at an outside of the third electrode and having an inner edge installed at an inside from the outer edge of the sample in a second size and an outer edge installed at an outside from the outer edge of the sample in a second size; a first voltage supply source installed in order to apply a positive voltage to the first electrode; a second voltage supply source installed in order to apply a negative voltage to the second electrode; a third voltage supply source installed in order to apply a positive voltage to the third electrode; a fourth voltage supply source installed in order to apply a negative voltage to the fourth electrode; the second electrode attracting the sample in a first size or the sample in a second size to the sample stage and serving as the first potential correcting electrode, the fourth electrode attracting the sample in a second size to the sample stage and serving as the second potential correcting electrode, the analyzer analyzing voltage of the second voltage supply source or the fourth voltage supply source and the controller controlling the voltage of the second voltage supply source or the fourth voltage supply source based on an analysis result of the analyzer.

More preferably, the present invention provides a semiconductor inspecting apparatus further including: an objective lens converging the charged particle beam on the sample and a shield electrode installed between the objective lens and the sample, having a hole on an optical axis of the charged particle beam, and maintained at equipotential to the sample, wherein a sum of at least one of a difference in a radial length between an outer edge of the second electrode and an outer edge of the sample in a first size and a difference in a radial length between an outer edge of the fourth electrode and an outer edge of the sample in a second size and a distance between a measurement position in measuring the outermost portion among measurement positions of the sample and the outer edge of the sample is equal to or larger than a radius of the hole of the shield electrode.

To achieve the above objects, the present invention provides an semiconductor inspecting apparatus including: a third electrode installed in a dielectric and at an inside from an outer edge of a sample having a first size for attracting the sample having a first size or a sample having a second size into a sample stage by applying voltage to the surface of the sample stage made of dielectric; a fourth electrode installed in a dielectric and at an inside from the outer edge of the sample having a first size and at an outside of the third electrode for attracting the sample having a first size or a sample having a second size into a sample stage by applying voltage to the sample stage, a fifth electrode in a dielectric and at an outside from the an outer edge of the sample having a first size and at an inside from the outer edge of the sample having a second size for attracting the sample having a second size into a sample stage by applying voltage to the fourth electrode, a sixth electrode in a dielectric and at an outside from the fifth electrode and at the inside from the outer edge of the sample having a second size for attracting the sample having a second size into a sample stage by applying voltage to the fifth electrode; and a sixth electrode in a dielectric and at an outside from the fifth electrode and at an inside from the outer edge of the sample having a second size for attracting the sample having a second size into a sample stage by applying voltage to the fifth electrode, a second voltage supply source installed to apply voltage at least one of the third electrode and the fifth electrode, and a third voltage supply source applying voltage having polarity different from the second voltage supply source to any one of the fourth electrode and the sixth electrode.

Effects of the Invention

As set for the above, the present invention can provide a semiconductor inspecting apparatus capable of preventing a position deviation occurring when inspecting an outer peripheral portion of a sample. Further, the present invention can provide application apparatuses such as an electronic drawing apparatus, etc., capable of preventing the position deviation occurring when patterns are drawn at the outer peripheral portion of the sample.

BEST MODES FOR CARRYING OUT THE INVENTION

Hereinafter, the present invention will be described with reference to best embodiments.

First Embodiment

Hereinafter, a first embodiment is an example of a semiconductor inspection apparatus using a charged particle beam applied to the present invention and a first embodiment applied to a CD-SEM will be described in detail with reference to FIGS. 1 to 5.

Figure 1:
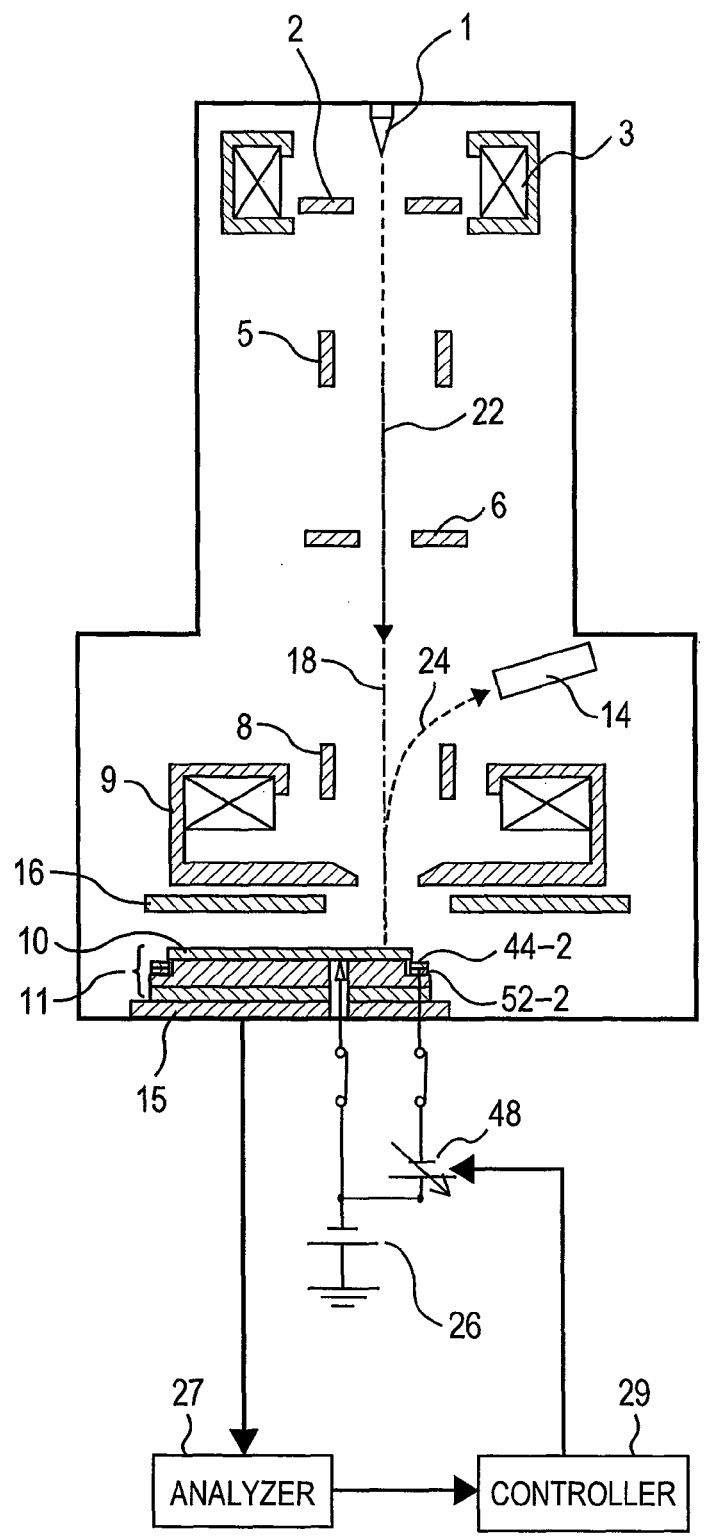
FIG. 1 is a side cross-sectional view showing a structure of a CD-SEM used in a first embodiment.
Figure 2:
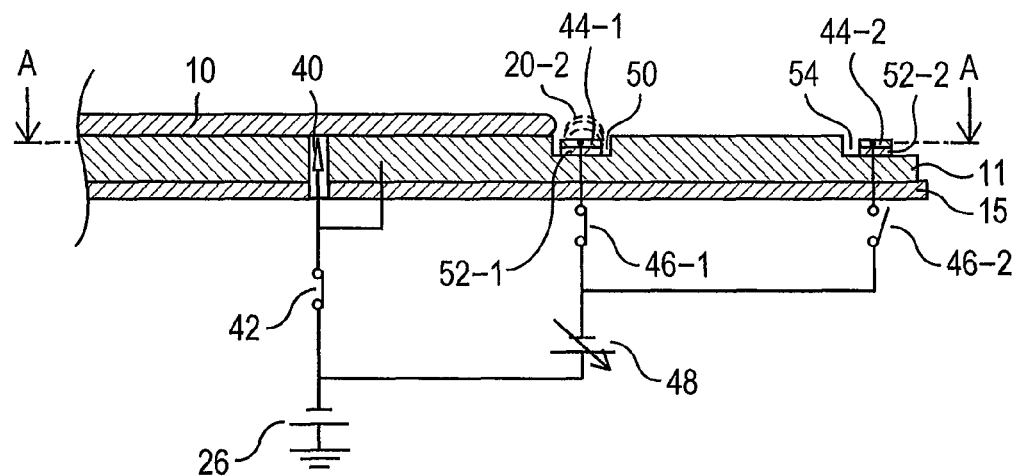
FIG. 2 is a side cross-sectional view showing a structure of a sample stage of a CD-SEM used in the first embodiment.
Figure 2:
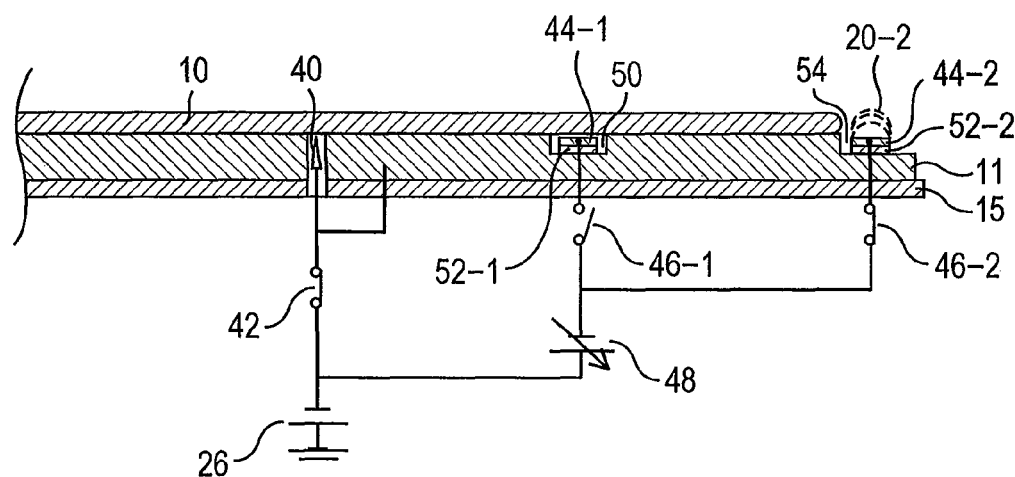
Figure 3:
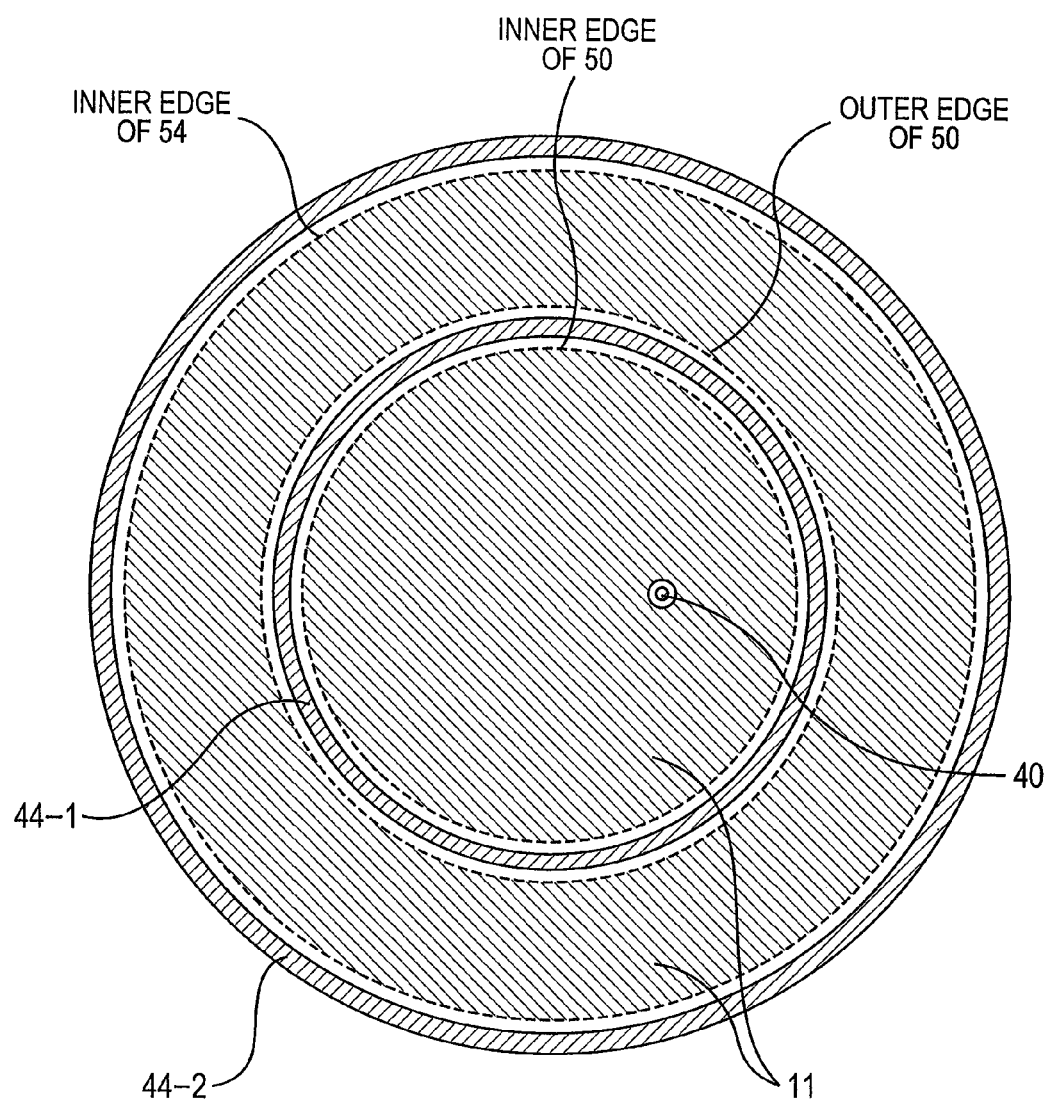
FIG. 3 is a diagram showing a sample stage of a CD-SEM used in the first embodiment and is a cross-sectional view taken along line A-A of FIG. 2.
Figure 4:
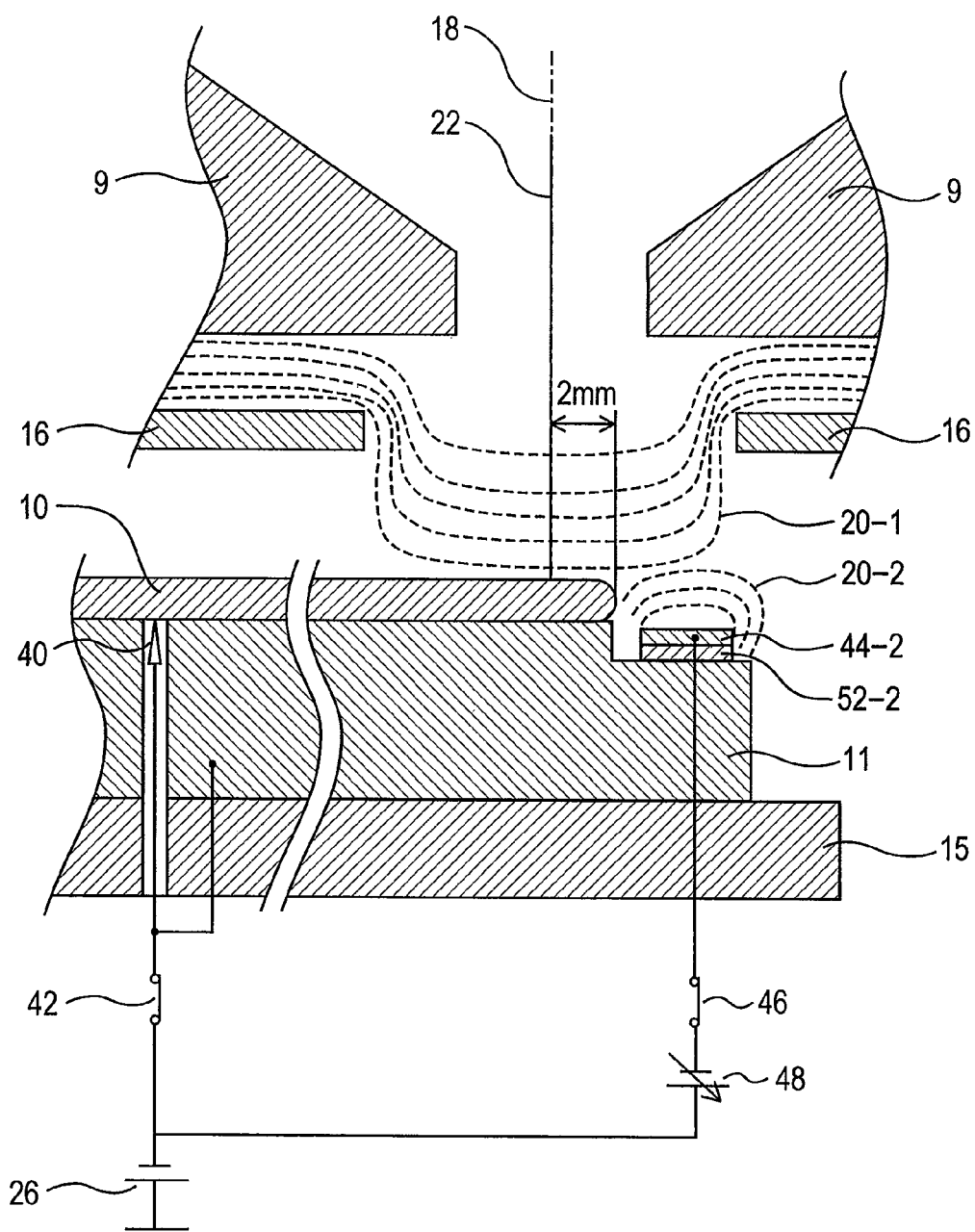
FIG. 4 is an enlarged side cross-sectional view of an objective lens, a shield electrode, and a vicinity of a CD-SEM and a sample stage used in the first embodiment.

FIG. 1 is a schematic diagram of an electron optical system of a CD-SEM. In addition, FIG. 2 is an enlarged diagram of a vicinity of a sample stage 11 used in a CD-SEM of the present embodiment. Among others, FIG. 2(A) shows a structure when a wafer of $\phi 300$ as a sample 10 is installed on the sample stage 11. In addition, FIG. 3 is a diagram showing a cross section of line A-A of the sample stage 11 used in the present embodiment of FIG. 2. Further, in order to easily facilitate the position relationship, an inner edge of a groove 50, an outer edge of the groove 50, and an inner edge of a concave portion 54 are shown by a dotted line. Further, FIG. 4 shows a structure of a vicinity of a sample stage 11, a shield electrode 16, and an objective lens 9 when a wafer of $\phi 450$ as the sample 10 is installed on the sample stage 11, in particular, structure when a position of 2 mm from the outer edge of the sample 10 is inspected.

Further, when the plural samples 10 having different sizes are handled, the description thereof will be sequentially described below from a sample having a small diameter to a sample having first and second sized diameters. In addition, plural electrodes in the sample stage and a power supply applying voltage thereto will be described on the whole or each function thereof will be described in principle. In the first embodiment, the sample 10 having the first size is a wafer of φ300 and the sample 10 having a second size is a wafer of φ450.

As shown in FIG. 1, a primary electron beam 22 from an electron gun 1 by a voltage from an extraction electrode 2 is converged and deflected by passing through a condenser lens 3, a scanning deflector 5, an aperture 6, an objective lens 9, or the like, and is then irradiated at an inspecting position of the sample 10 installed on the sample stage 11. When the inspection position is changed, the sample 10 moves by using an X-Y stage 15 installed below the sample stage 11. In addition, in the present embodiment, the sample 10 is a disc-shaped semiconductor wafer.

In addition, a shield electrode 16 applying a retarding potential and the same potential is installed at the vicinity of the sample 10, thereby relieving the disorder of the potential distribution at the vicinity of the sample 10. Further, the objective lens 9, etc., is configured in an axial symmetry shape using an optical axis 18 (shown by a dashed line) as a central axis.

The sample 10 is applied with a deceleration voltage (hereinafter, referred to as a retarding voltage) slower than that of a retarding power supply 26, in order to decelerate the primary electron beam 22. A second electron 24 is generated from the sample 10 by the irradiation of the primary electron beam 22 and moves upward.

An E cross B deflector 8 is installed to be adjacent to an electron gun side of the objective lens 9. The E cross B deflector 8 is a deflector that removes the amount deflected by electric field and magnetic field in the case of the primary electron beam 22 and deflects electrons by superimposing electric field and magnetic field in the case of the secondary electron 24. The secondary electron 24 moving upward from the sample 10 is deflected by the E cross B deflector 8 and is then input to a secondary electron detector 14. The secondary electron detector 14 converts the input secondary electron 24 into an electric signal, which is in turn amplified by a preamplifier (not shown) to a luminance modulating input for an inspection image signal, thereby obtaining an image data of an inspection region.

A potential correcting electrode 44-2 is formed at an outer region of the sample 10 on the sample stage 1 and is connected with a voltage variable DC power supply 48. As described below, the voltage of the DC power supply 48 is controlled according to the inspection position of the CD-SEM (a distance between the optical axis 18 and the outer edge of the sample 10). For this reason, an analyzer 27 obtains the distance between the optical axis 18 and the outer edge of the sample 10 from a coordinate of an X-Y stage 15 and obtains a setting voltage of the DC power supply 48 according to the distance and the irradiation condition of the primary electron beam 22 and the controller 29 controls the DC power supply 48 as the setting voltage thereof.

As shown in FIG. 2, the bottom surface (reverse side surface) of the sample 10 is pressed by a spring (not shown) to contact a contact pin 40 of a conductor. The contact pin 40 is connected to the retarding power supply 26 via a switch 42. In addition, the switch 42 is also connected to the conductive sample stage 11 and the switch 42 is turned-on to apply the retarding voltage (negative voltage) to the sample 10 and the sample stage 11. Further, the sample stage 11 of the outer region of the sample 10 is provided with a ring-shaped groove 50 and the bottom surface thereof is disposed at a position lower than the bottom surface of the sample 10. The bottom surface of the groove 50 is provided with an insulator 52-1 and the ring-shaped potential correcting electrode 44-1 is installed thereon. The potential correcting electrode 44-1 is connected with the voltage variable DC power supply 48 via a switch 46-1 and applies a negative voltage to the potential correcting electrode 44-1 by turning-on the switch 46-1. In this case, the retarding power supply 26 and the DC power supply 48 are connected to the potential correcting electrode 44-1 in series. Further, since the potential correcting electrode 44-1 and the sample stage 11 are electrically insulated from each other by the insulator 52-1, the potential correcting electrode 44-1 may be maintained at a potential (a negative potential having a large absolute value) lower than that of the sample 10. As a result, an equipotential surface 20-2 is elevated at the outside of the sample 10. In addition, when the sample 10 is a sample 10 having a first size, i.e., the wafer of φ300, since there is no need to apply voltage to the potential correcting electrode 44-2, it is preferable to turn-off the switch 46-2 connected thereto. Further, as can be clearly appreciated from FIG. 3, the ring-shaped electrode correcting electrodes 44-1 and 44-2 preferably have an approximate concentric shape with respect to the circular sample 10 and sample stage 11.

Next, when the sample 10 having a second size, i.e., a wafer of φ450 as the sample 10 is disposed on the sample stage 11, a structure of the vicinity of the sample stage 11 is shown in FIG. 2(B). The sample stage 11 disposed at the outer region of the sample 10 is disposed at a lower position than the bottom surface of the sample 10 and is provided with a concave part 54. The concave part 54 is provided with an insulator 52-2 and the ring-shaped potential correcting electrode 44-2 is installed thereon. The potential correcting electrode 44-2 is connected with the voltage variable DC power supply 48 via a switch 46-2 and applies a negative voltage to the potential correcting electrode 44-2 by turning-on the switch 46-2. In this case, the retarding power supply 26 and the DC power supply 48 are connected to the potential correcting electrode 44-2 in series. Further, since the potential correcting electrode 44-2 and the sample stage 11 are electrically insulated from each other by the insulator 52-2, the potential correcting electrode 44-2 may be maintained at a potential (a negative potential having a large absolute value) lower than that of the sample 10. As a result, an equipotential surface 20-2 is elevated at the outside of the sample 10. In addition, when the sample 10 is a sample 10 having a second size, i.e., the wafer of φ450, since there is no need to apply voltage to the potential correcting electrode 44-1, it is preferable to turn-off the switch 46-1 connected thereto.

Figure 15:
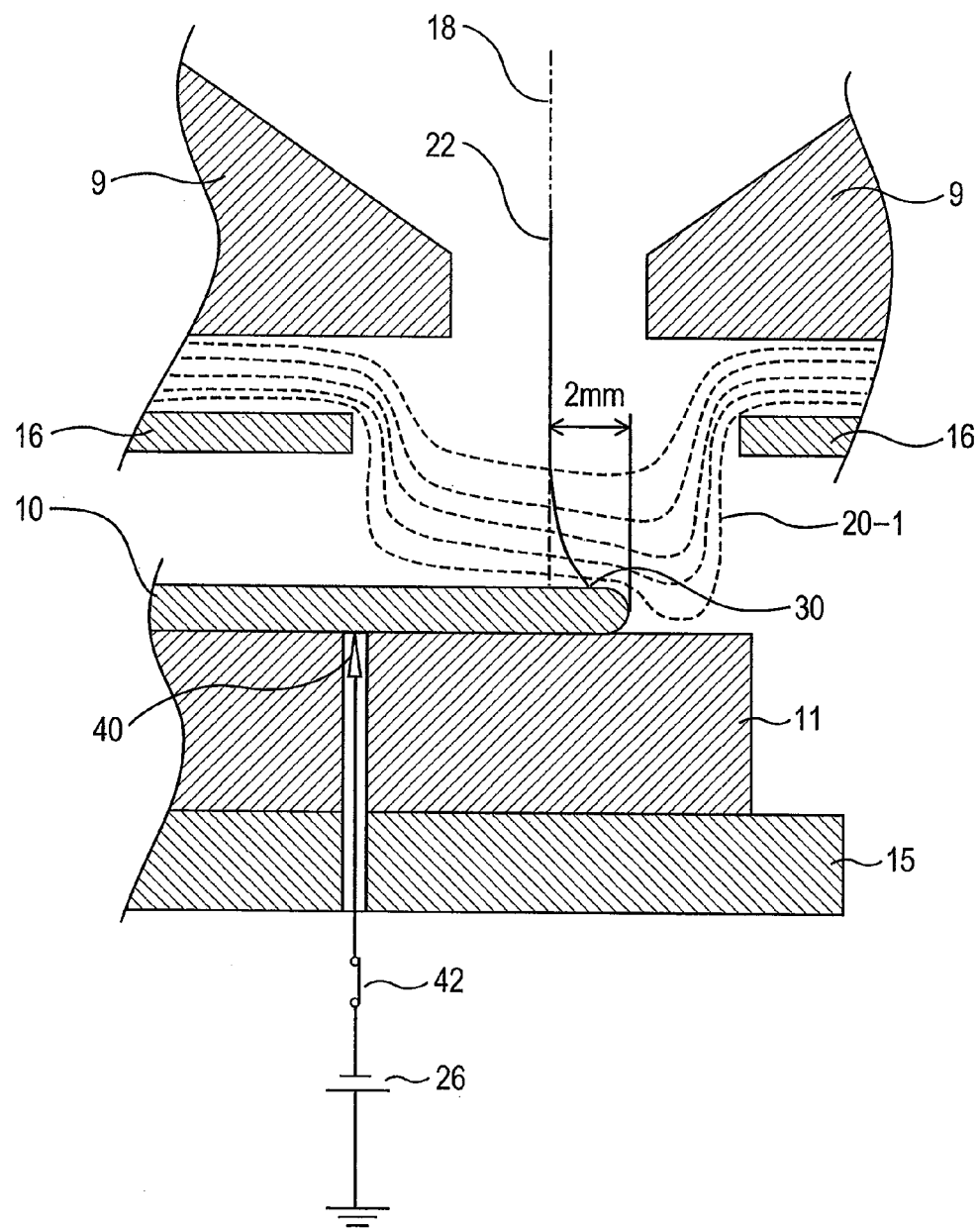
FIG. 15 is an enlarged side cross-sectional view of an objective lens and a shield electrode of a CD-SEM and a vicinity of a sample stage shown in FIG. 14.

Next, as shown in FIG. 4, when the potential of the potential correcting electrode 44-2 is maintained to be lower than the potential of the sample 10, an equipotential surface 20-2 is elevated at the outside of the sample 10 by the potential difference between the sample 10 and the potential correcting electrode 44-2. When the above-mentioned action is not performed, as shown in FIG. 15, the equipotential surface 20-1 falls at the outside of the sample 10 but according to a first embodiment, as shown in FIG. 4, the equipotential surface 20-2 is elevated such that the equipotential surface 20-1 is lifted upward. As a result, the equipotential surface 20-1 of the vicinity of the surface of the sample 10 has the axial symmetry distribution based on the optical axis 18 as a center. Therefore, even when the outer peripheral portion of the sample 10 is inspected, the equipotential surface 20-1 of the vicinity of the surface of the sample 10 has the axial symmetry distribution based on the optical axis as a center and the bending of the primary electron beam 22 is removed to prevent the position deviation.

In addition, FIG. 4 shows the case where the sample 10 is the sample 10 having a second size, i.e., the wafer of φ450, but as shown in FIG. 2(A), even in the case where the sample 10 is the sample 10 having the first size, i.e., the wafer of φ300, the potential of the potential correcting electrode 44-1 similarly becomes the potential (a negative potential having a larger absolute value) lower than that of the sample 10 to elevate the equipotential surface 20-2, such that the equipotential surface 20-1 at the outside of the sample 10 is lifted upward. As a result, the equipotential surface 20-1 has the axial symmetry distribution using the optical axis 18 as a center. Therefore, even when the outer peripheral portion of the sample 10 is inspected, the bending of the primary electron beam 22 is removed, thereby preventing the position deviation.

In addition, since the sample 10 is applied with the retarding voltage via the contact pin 40, the sample 10 is maintained at the retarding potential without having an effect on the potential of the potential correcting electrode 44-1 or the potential correcting electrode 44-2. In addition, the contact pin 40 is installed at the position capable of contacting the smallest sample (in the first embodiment, a diameter of the first size, i.e., 300 mm) among the used samples 10, such that it may also correspond to the sample 10 having different sizes.

In addition, in order to elevate the equipotential 20-2 by applying a negative voltage to the potential correcting electrode 44-1 and the potential correcting electrode 44-2, it is necessary to make the potential of each of the potential correcting electrode into the potential of the sample 10, that is, a potential (a negative potential having large absolute value) lower than the retarding potential. For this reason, it is necessary to install each of the potential correcting electrode and the sample 10 at the position where they do not contact each other. In addition, if the carrying of the sample fails when the sample 10 is installed on the sample stage 11, it is preferable that the sample 10 does not contact the potential correcting electrode 44-2. For this reason, in the first embodiment, the groove 50 and the concave part 54 are formed at the position near the outside of the sample 10 on the surface of the sample stage 11 and each of the potential correcting electrode 44-1 and the potential correcting electrode 44-2 is formed thereat, such that each of the potential correcting electrode is disposed below the bottom surface of the sample 10. Therefore, even when the sample 10 is installed on the sample stage 11 having different sizes, if the carrying of the sample 10 fails when the sample 10 is installed on the sample stage 11, there is no risk of interfering the sample 10 with each of the potential correcting electrode, such that the potential of each of the potential correcting electrode may be effectively maintained at the potential lower than that of the sample 10, i.e., the retarding potential.

According to the above-mentioned structure, even when the sample 10 having different sizes is inspected, the bending of the primary electron beam 22 is removed, thereby preventing the position deviation.

As shown in FIG. 15, the magnitude of falling the equipotential surface 20-1 at the outside of the sample 10 when voltage is not applied to the potential correcting electrode 44-1 or the potential correcting electrode 44-2 is changed according to the inspection position of the CD-SEM, i.e., the distance between the optical axis 18 and the outer edge of the sample 10. In addition, a magnitude of increasing the equipotential surface 20-2 is changed according to the magnitude in voltage applied to the potential correcting electrode 44-1 or the potential correcting electrode 44-2 and the distribution of the equipotential surface 20-1 near the sample 10 is changed accordingly. For this reason, in order to remove the bending of the primary electron beam 22, the optimal voltage applied to the potential correcting electrode 44-1 or the potential correcting electrode 44-2 is changed according to the distance between the optical axis 18 and the outer edge of the sample 10. In addition, the optimal voltage is changed by the structure of the inspection apparatus, such as the structure of the objective lens 9, etc., and the retarding potential, etc. In the CD-SEM according to the first embodiment, when the retarding voltage is −2500V and the sample 10 having the first size, i.e., the wafer of φ300 is inspected, the inventors confirm through the experiment that the relationship between the voltage (the potential of the potential correcting electrode 44-1 is a potential applying the retarding voltage to the voltage) of the DC power supply 48 and the bending amount of the primary electron beam 22 is shown as the graph as shown in FIG. 5(A). Further, from the foregoing experiment, when the distance from the outer edge of the sample 10 to the inspection position (a position of the optical axis 18) having the problem with the bending of the primary electron beam 22 is 1 to 4 mm, the voltage of the DC power supply 48, i.e., the optimal voltage in order to make the bending amount of the primary electron beam 22 into zero can be appreciated from FIG. 5(B). The potential of the potential correcting electrode 44-1 is changed by previously obtaining the data and changing the voltage of the DC power supply 48 according to the inspection position to change the potential of the potential correcting electrode 44-1, thereby preventing the bending of the primary electron beam 22. As a result, even when the outer peripheral portion of the sample 10 is inspected, the position deviation may be removed.

Further, the case where the sample 10 having the first size, the wafer of φ300 as the sample 10 is performed is described as an example and even when the sample 10 having a second size, i.e., the wafer of φ450 is inspected, the bending of the primary electron beam 22 is prevented by the same method, thereby making it possible to inspect the position deviation even in the case of the outer peripheral portion of the sample 10. However, since the thickness of the wafer of φ450 and the wafer of φ300 is different, the optimal voltage of the DC power supply 48 for making the bending of the primary electron beam 22 into zero is different. For this reason, even when the sample 10 is the sample 10 of a second size, i.e., the wafer of φ450, there is a need to previously obtain data as shown in FIGS. 5A and 5B.

As described above, the data of the voltage of the DC power supply 48 controlled according to the distance between the optical axis 18 and the outer edge of the sample 10 is stored in the analyzer 27 shown in FIG. 1. The analyzer 27 obtains the distance between the optical axis 18 and the outer edge of the sample 10 from the coordinate of the X-Y stage 15 and obtains the setting voltage of the DC power supply 48 according to the distance, the thickness of the sample 10, and the irradiation conditions of the primary electron beam 22 such as the retarding voltage, etc., and the controller 29 controls the voltage of the DC power supply 48 as the setting voltage thereof. Therefore, the first embodiment controls the potential of the potential correcting electrode 44-1 and the potential correcting electrode 44-2 to prevent the bending of the primary electron beam 22, thereby making it possible to remove the position deviation even in the case of inspecting the outer peripheral portion of the sample 10.

Second Embodiment

Next, a second embodiment of the present invention will be described with respect to only portions different from the first embodiment. Although the first exemplary of the present invention installs the sample 10 on the sample stage 11, it does not attract the sample 10. On the other hand, the second embodiment uses the electrostatic chuck as the sample stage 11 to attract the sample 10 into the sample stage 11 and firmly hold the sample thereto. Hereinafter, the structure of the second embodiment will be described with reference to FIGS. 6 to 8.

Figure 7:
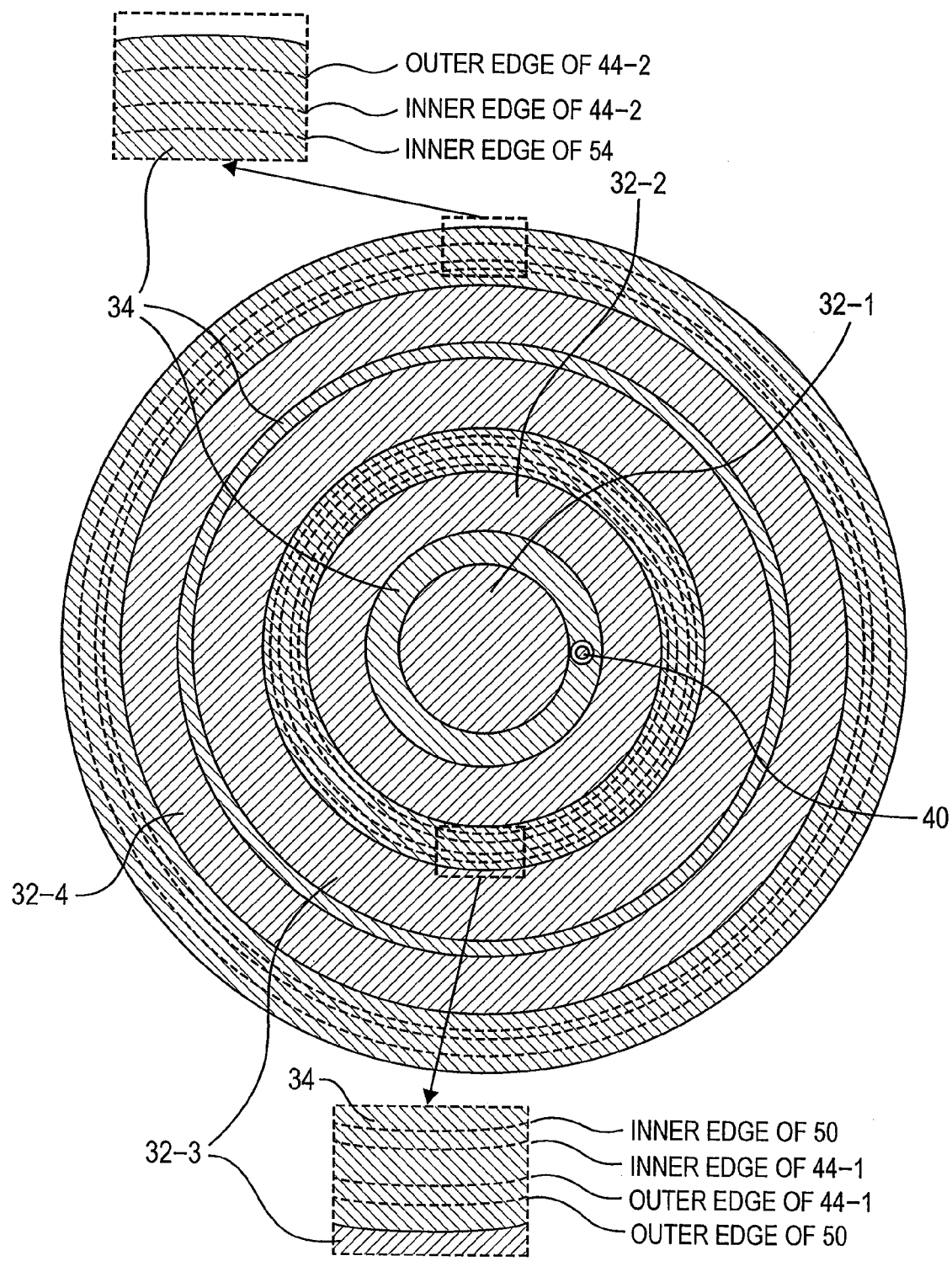
FIG. 7 is a diagram showing a sample stage of a CD-SEM used in the second embodiment and is a cross-sectional view taken along line B-B of FIG. 6.
Figure 8:
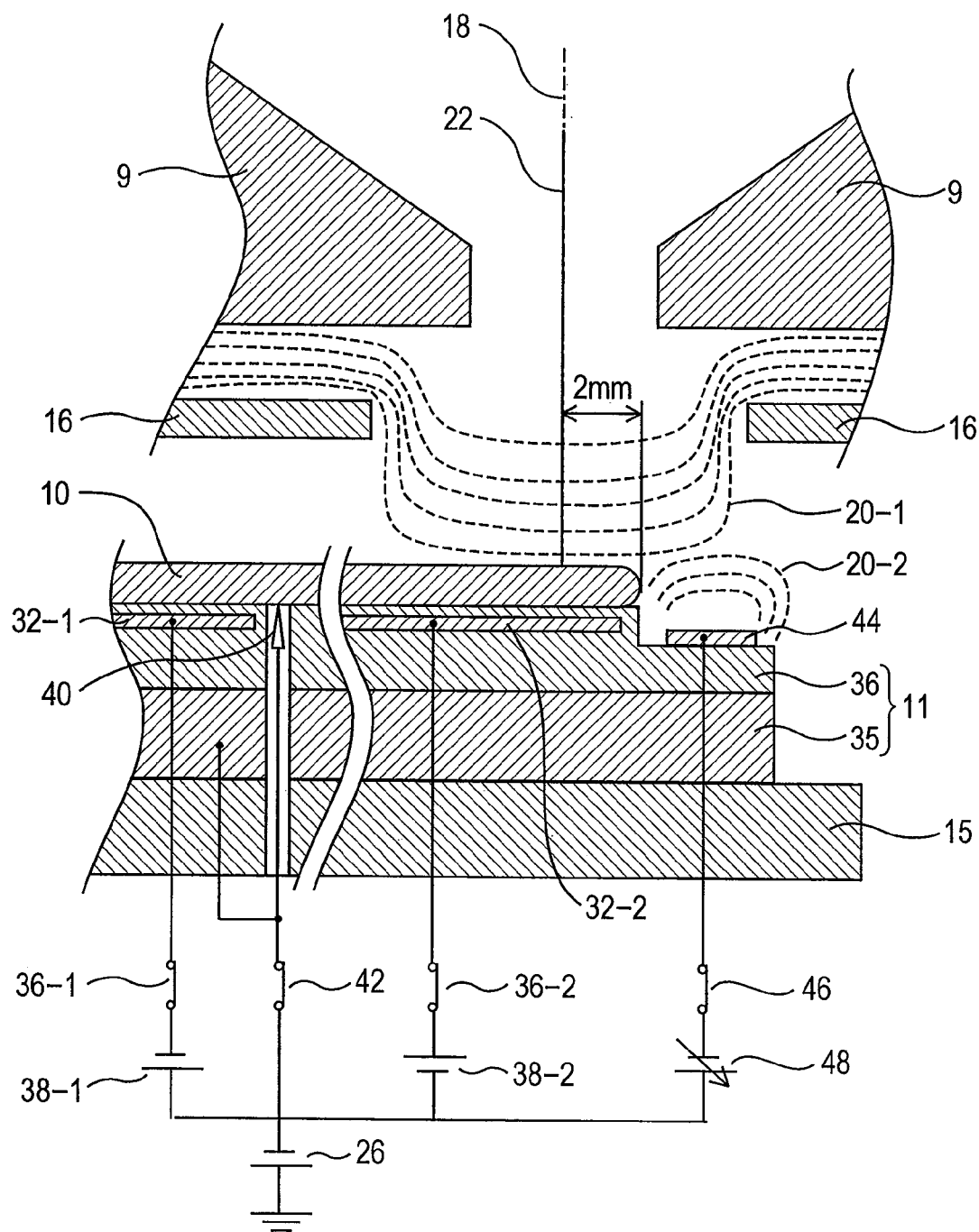
FIG. 8 is an enlarged side cross-sectional view of an objective lens and a shield electrode of a CD-SEM and a vicinity of a sample stage used in the second embodiment.

FIGS. 6A and 6B each are a diagram showing a structure of the vicinity of the sample stage 11 when the sample 10 having a first size, i.e., the wafer of φ300 as the sample is installed on the sample stage 11 and when the sample 10 having a second size, i.e., the wafer of φ450 as the sample is installed on the sample stage 11, respectively. In addition, FIG. 7 is a top view showing a cross-sectional view taken along line B-B of the sample stage 11 shown in FIG. 6(A). Further, in order to easily appreciate the positional relationship, the inner edge and the outer edge of the groove 50, the inner edge and the outer edge of the potential correcting electrode 44-1, the inner edge of the concave portion 54, and the inner edge and the outer edge of the potential correcting electrode 44-2 are shown by a dotted line. In addition, FIG. 8 is a diagram showing a structure of the vicinity of the sample stage 11, the shield electrode 16, and the objective lens 9 when the sample 10 of a second size, i.e., the wafer of φ450 as the sample is installed on the sample stage 11.

Figure 6:
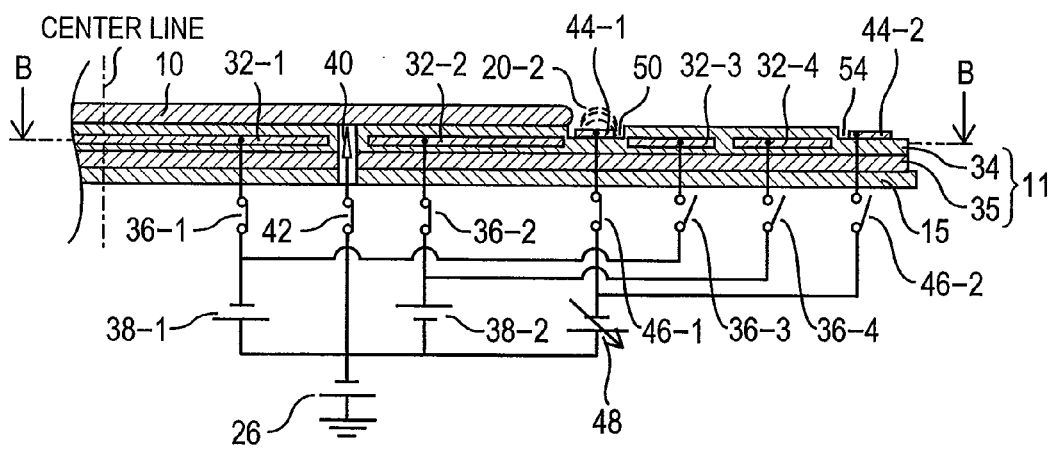
FIG. 6 is a side cross-sectional view showing a structure of a sample stage of a CD-SEM used in a second embodiment.
Figure 6:
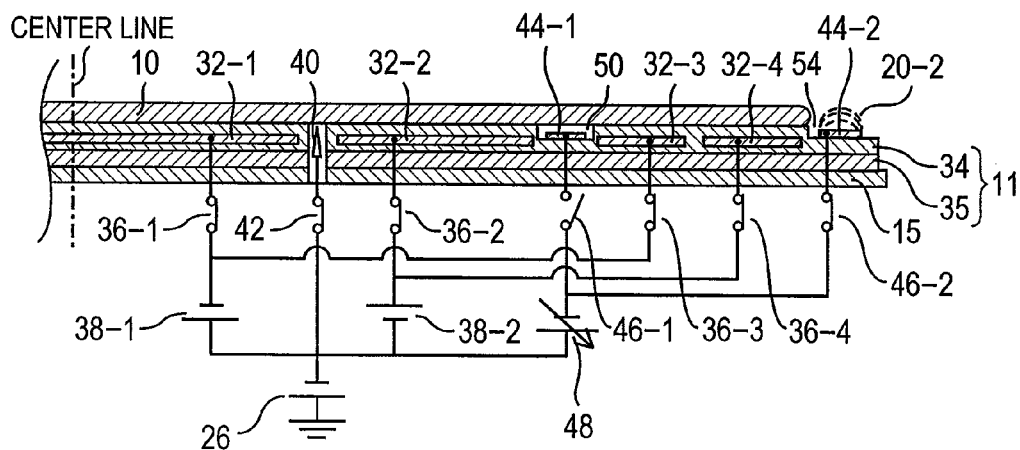

As shown in FIG. 6, the sample stage 11 used in the second embodiment is configured to include a dielectric part 34 of ceramic and a metal base 35, attracting electrodes 32-1 to 32-4 installed in the dielectric part 34, and the potential correcting electrodes 44-1 to 44-2 formed on the surface of the dielectric part 34. In addition, the outer edge of the electrode 32-2 is configured to have a diameter equal to or smaller than the outer edge of the sample 10 having a first size, i.e., the wafer of φ300 as the sample 10. Similarly, the outer edge of the electrode 32-4 is configured to have a diameter equal to or smaller than the outer edge of the sample 10 having a second size, i.e., the wafer of φ450 as the sample 10.

As shown in FIG. 6(A), when the sample 10 having a first size, i.e., the wafer of φ300 as the sample 10 is installed on the sample stage 11, the electrode 32-1 and the electrode 32-2 are each connected to the DC power supply 38-1 and the DC power supply 38-2 via the switches 36-1 and 36-2 and these switches are turned-on to apply the positive and negative voltage to the electrode 32-1 and the electrode 32-2, respectively. The bottom surface (rear surface) of the sample 10 is provided with the contact pin 40 pressed by the spring (not shown) and connected to the retarding power supply 26 via the switch 42 and is applied with the retarding voltage by turning-on the switch 42. In addition, since the DC power supply 38-1 applying the negative voltage and the DC power supply 38-2 applying the positive voltage are also connected with the retarding power supply 26 in series, the positive and negative voltage based on the retarding potential is applied to the electrode 32-1 and the electrode 32-2, respectively. Consequently, a coulomb force or Jonhson-Rahbeck force are generated to effectively attract the sample 10 to the surface of the sample stage 11. In addition, the attracting surface to attract the sample 10 on the surface of the sample stage 11 is configures to planarize the sample 10 when the sample 10 is attracted. In addition, the electrode 32-1 and the electrode 32-2 are configured to cover approximately the whole region of the sample 10 to generate the adsorption force to the sample stage 11 over the whole region of the sample 10, such that even the bent sample 10 is attracted to be planarized.

The surface of the dielectric part 34 of the outer region of the sample 10 is provided with a ring-shaped groove 50 and the bottom surface thereof is disposed at a position lower than the bottom surface of the sample 10. In addition, the bottom surface of the groove 50 is coated with a conductive film (for example, a metal film), such that the ring-shaped potential correcting electrode 44-1 is formed. The ring-shaped potential correcting electrode 44-1 is connected with the voltage variable DC power supply 48 via the switch 46-1 and the switch 46-1 is turned-on to apply the negative voltage to the potential correcting electrode 44-1, such that the equipotential surface 20-2 is elevated at the outside of the sample. Therefore, similar to the first embodiment, even when the outer peripheral portion of the sample 10 is inspected, the equipotential surface 20-1 (not shown) of the vicinity of the surface of the sample 10 has the axial symmetry distribution based on the optical axis as a center and the bending of the primary electron beam 22 is removed to prevent the position deviation. In addition, when the sample 10 is a sample 10 having a first size, i.e., the wafer of φ300, since there is no need to apply voltage to the electrode 32-3, the electrode 32-4, and the potential correcting electrode 44-2, it is preferable to turn-off the switch 36-3, the switch 36-4, and the switch 46-2 connected thereto.

Next, when the sample 10 having a second size, i.e., a wafer of φ450 as the sample 10 is disposed on the sample stage 11, a structure of the vicinity of the sample stage 11 is shown in FIG. 6(B). In this case, similar to the use of the sample 10 having a first size, i.e., the wafer of φ300 shown in FIG. 6(A), voltage is applied to the electrode 32-1 and the electrode 32-2 as well as voltage is also applied to the electrode 32-3 and the electrode 32-4. These electrode 32-3 and electrode 32-4 are also connected with the DC power supply 38-1 and the DC power supply 38-2, respectively, via the switch 36-3 and the switch 36-4. For this reason, these switches 36-1 to 36-4 are turned-on, such that the sample 10 is attracted into the sample stage 11. In this case, the electrode 32-1 to 32-4 are configured to cover approximately the whole region of the sample 10 to generate the adsorption force to the sample stage 11 over the whole region of the sample 10, such that even the bent sample 10 is attracted to be planarized.

The dielectric part 34 disposed at the outer region of the sample 10 is concavely disposed at a lower position than the bottom surface of the sample 10. The surface thereof is provided with the potential correcting electrode 44-2 and the potential correcting electrode 44-2 is connected to the DC power supply 48 via the switch 46-2. The switch 46-2 is turned-on to apply the negative voltage to the potential correcting electrode 44-2 such that the equipotential surface 20-2 is elevated at the outside of the sample 10. Therefore, as shown in FIG. 8, the equipotential surface 20-1 of the vicinity of the surface of the sample 10 has an axial symmetry distribution based on the optical axis similar to the first exemplary embodiment and the bending of the primary electron beam 22 is removed, thereby preventing the position deviation. In addition, even when the sample 10 is the sample having a second size, i.e., the wafer of φ450, the potential correcting electrode 44-1 is formed at the bottom surface of the groove 50, such that the sample 10 and the potential correcting electrode 44-1 are installed and attracted on the sample stage 11 without the sample 10 and the potential correcting electrode 44-1 being interfering and contacting with each other. In addition, when the sample 10 is a sample 10 having a second size, i.e., the wafer of φ450, since there is no need to apply voltage to the potential correcting electrode 44-1, it is preferable to turn-off the switch 46-1.

In addition, since the sample 10 is applied with the retarding voltage via the contact pin 40, the sample 10 is maintained at the retarding potential without having an effect on the potential of the potential correcting electrode 44 or the electrode 32-1 at the inside thereof or the electrode 32-2 at the outside thereof. In addition, the contact pin 40 is installed at the position capable of contacting the smallest sample (in the second embodiment, a diameter of the first size, i.e., 300 mm)

among the used samples, such that it may also correspond to the sample 10 having different sizes. According to the above-mentioned structure, even when the sample 10 having different sizes is inspected, the bending of the primary electron beam 22 is prevented in the case of inspecting the outer peripheral portion, thereby making it possible to prevent the position deviation.

In addition, as described above, when the contact pin 40 is pressed on the sample 10 by the spring but the sample 10 is not attracted into the sample stage 11, the sample 10 is pushed up by the contact pin 40 such that it is floated from the sample stage 11 or the region pressed by the contact pin 40 of the sample 10 may be convexly bent. When there is a need to measure the precision of a nanometer level such as the CD-SEM used in the embodiment, the degradation in the measurement precision is caused, which is not preferable. On the other hand, since the second embodiment uses the electrostatic chuck as the sample stage 11 to firmly attract the sample 10 into the sample stage 11, the sample 10 is lifted up by the contact pin 40, such that there is no risk that it may be floated from the sample stage 11 or the region pressed by the contact pin 40 of the sample 10 may be bent, thereby making it possible to prevent the degradation of the measurement precision.

In addition, when the electrostatic chuck is not used as the sample stage 11 as in the first embodiment, the height of the outer edge of the sample 10 is not uniform over the whole circumference of 360 degree in the case of the bent sample 10. In this case, when the vicinity of the outer edge of the sample 10 is inspected, a scheme of falling the equipotential surface 20-1 of the vicinity of the outer edge of the sample is changed according to the position of the circumference direction. In this case, the optimal voltage of the DC power supply 48 is changed according to the position of the circumference direction of the inspecting position in addition to the distance between the optical axis 18 and the outer edge of the sample 10 and the irradiation conditions of the primary electron beam 22, such that the control of the DC power supply 48 is complicated. On the other hand, the second embodiment uses the electrostatic chuck as the sample stage 11, the sample 10 is attracted on the whole surface of the sample stage 11 to remove the bending of the sample 10, such that the height at the outer edge of the sample 10 is uniform over the entire circumference of 360 degree. For this reason, the factors of determining the optimal voltage of the DC power supply 48 are only the distance between the optical axis 18 and the outer edge of the sample 10, the thickness of the sample 10, and the irradiation conditions of the primary electron beam 22, such that it is easy to control the DC power supply 48.

In addition, the potential correcting electrode (in the second embodiment, the potential correcting electrode 44-1) used when the small sample 10 (in the second embodiment, a wafer having a first size, i.e., φ300) is inspected is not necessarily disposed at a position lower than the bottom surface of the sample 10, but the potential correcting electrode (in the second embodiment, the potential correcting electrode 44-2) used when the largest sample 10 (in the second embodiment, a wafer having a second size, i.e., φ450) is observed is not limited thereto. Therefore, the potential correcting electrode may be installed at position higher than the bottom surface of the sample 10 if the position is a position where the sample 10 and the potential correcting electrode do not contact each other. However, if the carrying of the sample fails when the sample 10 is installed on the sample stage 11, there is a risk of contacting the potential correcting electrode 44-2 to the sample 10 in the structure where the potential correcting electrode 44-2 is at the position higher than the bottom surface of the sample 10. In this case, the particle generated by the contact may be attached to the sample 10, which becomes a cause of degrading the manufacturing yield of the semiconductor. For this reason, when the largest sample 10 is observed, it is preferable that the used potential correcting electrode 44-2 is installed at a position lower than the bottom surface of the sample 10.

In addition, as in the second embodiment, when the electrostatic chuck is used as the sample stage 11, it is important to remove the residual adsorption of the sample 10 into the sample stage 11 by turning-off the switches 36-1 to 36-4 after the measurement processing is performed. To this end, it is preferable that the areas of the positive and negative electrodes are the same. In the second embodiment, it is preferable that the areas of the electrode 32-1 and the electrode 32-2 are the same, and that the areas of the electrode 32-3 and the electrode 32-4 are the same.

In addition, as can be clearly appreciated from FIG. 7, similarly to the ring-shaped potential correcting electrodes 44-1 and 44-2, it is preferable that each electrode 32-2, 32-3, and 32-4 is formed in a concentric shape approximately similar to a circular electrode 32-1.

Further, although the second embodiment shows ceramic as the dielectric material of the dielectric part 34, alumina or SIC, etc., is used. In addition, the dielectric material in addition to ceramic, etc., such as polyimide, or the like, may be also used.

As described above, similar to the first embodiment, the analyzer 27 obtains the distance between the optical axis 18 and the outer edge of the sample 10 from a coordinate of an X-Y stage 15 and obtains the setting voltage of the DC power supply 48 according to the distance and the irradiation condition of the primary electron beam 22 such as the retarding voltage, etc., by applying the shown sample stage 11 to the CD-SEM shown in FIG. 1 and the controller 29 controls the DC power supply 48 as the setting voltage thereof. Therefore, the bending of the primary electron beam 22 is prevented by controlling the potential of the electrode 32-3 or the potential correcting electrode 44-2, thereby obtaining the effect of removing the position deviation even in the case of inspecting the outer peripheral portion of the sample 10. Further, since the second embodiment uses the electrostatic chuck as the sample stage 11 to firmly attract the sample 10 into the sample stage 11, the sample 10 is lifted up by the contact pin 40, such that there is no risk that it may be floated from the sample stage 11 or the region pressed by the contact pin 40 of the sample 10 may be bent, thereby making it possible to prevent the degradation of the measurement precision.

Third Embodiment

Figure 9:
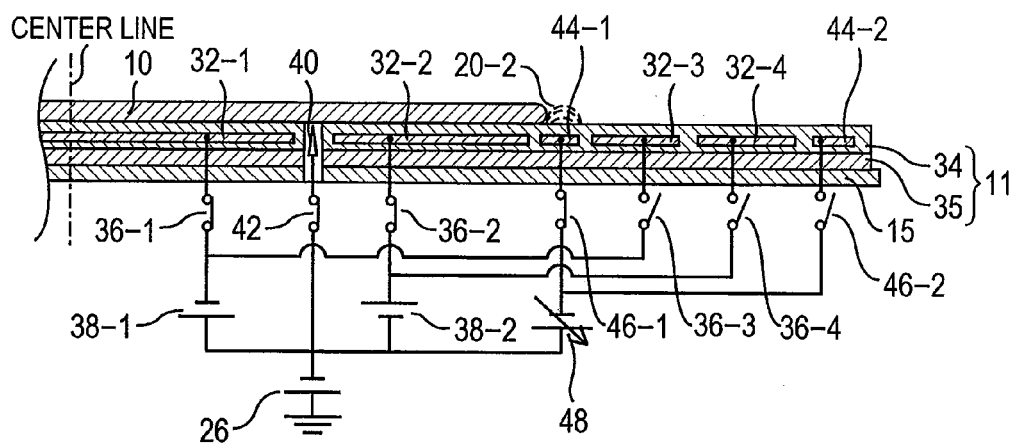
FIG. 9 is a side cross-sectional view showing a structure of a sample stage of a CD-SEM used in a third embodiment.
Figure 9:
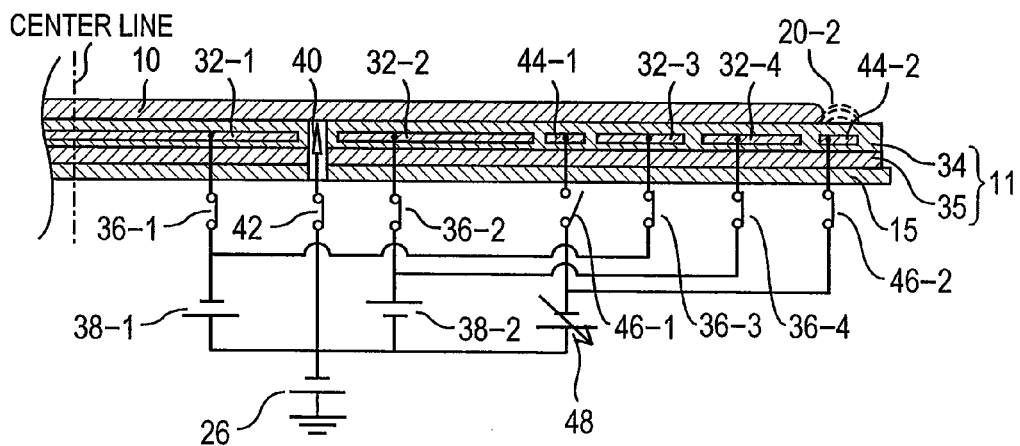

Next, a third embodiment of the present invention will be described with respect to only portions different from the second embodiment. The second embodiment forms the groove 50 or the concave part 54 on the surface of the dielectric portion 34 of the sample stage 11 that is the electrostatic chuck and the bottom surface thereof is provided with the potential correcting electrode 44-1 and the potential correcting electrode 44-2, respectively. In this case, in addition to the process of manufacturing the sample stage 11 having the general electrostatic chuck structure, the process of forming the groove 50 and the concave part 54 in the dielectric portion 34 and the process of forming the potential correcting electrode 44-1 and the potential correcting electrode 44-2 are newly needed. Therefore, the third embodiment has a relatively simple structure. The third embodiment installs the potential correcting electrode 44-1 and the potential correcting electrode 44-2 at the position at the outside of the sample 10 or below the bottom surface of the sample 10 to implement a mechanism of preventing the bending of the primary electron beam even when inspecting the vicinity of the outer edge of the sample 10. Hereinafter, the third embodiment will be described with reference to FIG. 9.

FIG. 9(A) is an enlarged view of a structure of the vicinity of the sample stage 11 when the sample 10 having a first size, i.e., the wafer of ϕ300 as the sample 10 is installed on the sample stage 11.

The attracting electrodes 32-1 and 32-2 are each connected with the DC power supply 38-1 and the DC power supply 38-2 via the switches 36-1 and the switches 36-2 and turn-on these switches to attract the sample 10 into the sample stage 11. The inside of the dielectric part 34 of the outer region of the sample 10 is provided with the ring-shaped potential correcting electrode 44-1 and the voltage variable DC power supply 48 is connected thereto via a switch 46-1 and the negative voltage is applied to the potential correcting electrode 44-1 by turning-on the switch 46-1. The potential correcting electrode 44-1 is covered with the dielectric part 34 made of the dielectric (in the present embodiment, ceramic) of the relative dielectric constant of about 8 to 10 and the equipotential surface 20-2 is elevated at the outside of the sample 10 by the dielectric part 34. Therefore, similar to the first and second embodiments, even when the outer peripheral portion of the sample 10 is inspected, the equipotential surface 20-1 (not shown) of the vicinity of the surface of the sample 10 has the axial symmetry distribution based on the optical axis as a center and the bending of the primary electron beam 22 is removed to prevent the position deviation. In addition, when the sample 10 is a sample 10 having a first size, i.e., the wafer of ϕ300, since there is no need to apply voltage to the electrode 32-3, the electrode 32-4, and the potential correcting electrode 44-2, it is preferable to turn-off the switch 36-3, the switch 36-4, and the switch 46-2 connected thereto.

Next, when the sample 10 having a second size, i.e., a wafer of ϕ450 as the sample 10 is disposed on the sample stage 11, a structure of the vicinity of the sample stage 11 is shown in FIG. 9(B). In this case, similar to the use of the sample 10 having a first size, i.e., the wafer of ϕ300 shown in FIG. 9(A), voltage is applied to the electrode 32-1 and the electrode 32-2 as well as voltage is also applied to the attracting electrode 32-3 and electrode 32-4. These electrode 32-3 and electrode 32-4 are also connected with the DC power supply 38-1 and the DC power supply 38-2, respectively, via the switch 36-3 and the switch 36-4. For this reason, these switches 36-1 to 36-4 are turned-on, such that the sample 10 is attracted into the sample stage 11. In this case, the attracting electrode 32-1 to 32-4 are configured to cover approximately the whole region of the sample 10 to generate the adsorption force to the sample stage 11 over the whole region of the sample 10, such that even the bent sample 10 is attracted to be planarized.

The inside of the dielectric part 34 of the outer region of the sample 10 is provided with the potential correcting electrode 44-2 and the potential correcting electrode 44-2 is connected to the DC power supply 48 via the switch 46-2. The switch 46-2 is turned-on to apply the negative voltage to the potential correcting electrode 44-2 such that the equipotential surface 20-2 is elevated at the outside of the sample 10. Therefore, similar to the first embodiment, the equipotential surface 20-1 (not shown) of the vicinity of the surface of the sample 10 has the axial symmetry distribution based on the optical axis as a center and the bending of the primary electron beam 22 is removed to prevent the position deviation. In addition, when the sample 10 is the wafer of ϕ450, since there is no need to apply voltage to the potential correcting electrode 44-1, it is preferable to turn-off the switch 46-1.

In addition, the potential correcting electrode 44-1 and the potential correcting electrode 44-2 are disposed at a lower position than the bottom surface of the sample 10. Further, since they are covered with the dielectric part 34, there is no risk of interfering or contacting with the sample 10.

As described above, similar to the first embodiment, the analyzer 27 obtains the distance between the optical axis 18 and the outer edge of the sample 10 from a coordinate of an X-Y stage 15 and obtains the setting voltage of the DC power supply 48 according to the distance and the irradiation condition of the primary electron beam 22 such as the retarding voltage, etc., by applying the shown sample stage 11 to the CD-SEM shown in FIG. 1 and the controller 29 controls the DC power supply 48 as the setting voltage thereof. Therefore, the first embodiment controls the potential of the potential correcting electrode 44-1 or the potential correcting electrode 44-2 to prevent the bending of the primary electron beam 22, thereby making it possible to remove the position deviation even in the case of inspecting the outer peripheral portion of the sample 10.

Further, the third embodiment uses the electrostatic chuck as the sample stage 11, the sample 10 is attracted on the whole surface of the sample stage 11 to remove the bending of the sample 10, such that the height at the outer edge of the sample 10 is uniform over the entire circumference of 360 degree. As a result, as shown in the second embodiment, the factors of determining the optimal voltage of the DC power supply 48 are only the distance between the optical axis 18 and the outer edge of the sample 10, the thickness of the sample 10, and the irradiation conditions of the primary electron beam 22, such that it is easy to control the DC power supply 48.

In addition, the third embodiment forms the potential correcting electrode 44-1 and the potential correcting electrode 44-2 in the dielectric part 34 made of ceramic. The structure may be formed by printing the shape of the electrodes 32-1 to 32-4 and the potential correcting electrode 44-1 and the potential correcting electrode 44-2 on the green sheet of the dielectric by a screen printing method using paste including a conductor (for example, tungsten), overlapping a green sheet having different dielectric therewith, stacking and integrating it by the heating pressure, and burning it. For this reason, similar to the structure shown in the second embodiment, a complicated process of forming the groove 50 or the concave part 54 in the dielectric part 34 and forming the potential correcting electrode 44-1 and the potential correcting electrode 44-2 therein may be avoided, thereby making it possible to manufacture the sample stage 11 at low cost.

Fourth Embodiment

Figure 10:
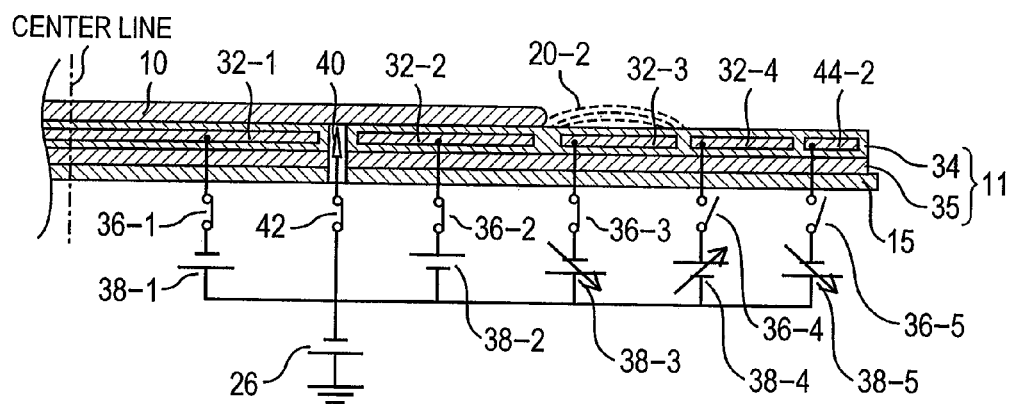
FIG. 10 is a side cross-sectional view showing a structure of a sample stage of a CD-SEM used in a fourth embodiment.
Figure 10:
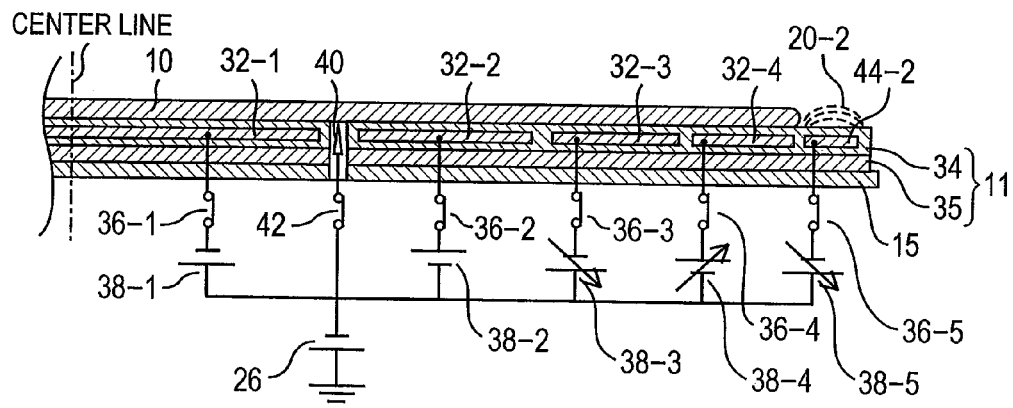

Next, a fourth embodiment will be described. In the third embodiment, the two potential correcting electrode 44-1 and potential correcting electrode 44-2 each used when two kinds of samples 10 having different sizes are inspected are installed in the dielectric part 34 of the sample stage 11. On the other hand, in the fourth embodiment, the attracting electrode used to attract the large sample 10 into the sample stage 11 is used as the potential correcting electrode when the small sample 10 is measured, such that it corresponds to the measurement of the sample 10 having a different size by a relatively simple structure. Hereinafter, the fourth embodiment will be described only portions different from the first to third embodiments with reference to FIG. 10.

FIG. 10(A) is an enlarged view of the structure of the vicinity of the sample stage 11 when the sample 10 having a first size, i.e., the wafer of ϕ300 as the sample 10 is installed on the sample stage 11. The electrode 32-1 and the electrode 32-2 are each connected to the DC power supply 38-1 and the DC power supply 38-2 via the switches 36-1 and 36-2 and these switches are turned-on to attract the sample 10 into the sample stage 11.

The ring-shaped electrode 32-3 and 32-4 are formed in the dielectric part 34 of the outer region of the sample 10 having a first size, i.e., the wafer of φ300 and turns-on the switch 36-3 to allow the voltage variable power supply 38-3 connected to the retarding power supply 26 in series to apply voltage (a negative voltage having a large absolute voltage) lower than the retarding voltage to the electrode 32-3, such that the equipotential surface 20-2 is elevated at the outside of the sample 10 through the dielectric part 34. Therefore, similar to the first to third embodiments, even when the outer peripheral portion of the sample 10 is inspected, the equipotential surface 20-1 (not shown) of the vicinity of the surface of the sample 10 has the axial symmetry distribution based on the optical axis as a center and the bending of the primary electron beam 22 is removed to prevent the position deviation. Further, as described above, in order to prevent the bending of the primary electron beam 22, since there is a need to control voltage applied to the electrode at the outside of the sample 10, the power supply 38-3 is the voltage variable DC power supply.

In addition, as shown in FIG. 10(B), when the sample 10 is the sample 10 having a second size, similar to the third embodiment, the wafer of φ450, the switch 36-5 is turned-on to apply voltage (a negative voltage having a larger absolute voltage) lower than the retarding voltage to the potential correcting electrode 44-2 installed at the outer region of the sample 10 of the dielectric part 34, such that the equipotential surface 20-2 is elevated. The equipotential surface 20-1 (not shown) at the vicinity of the surface of the sample 10 is the axial symmetry distribution based on the optical axis, such that the bending of the primary electron beam 22 is removed, thereby preventing the position deviation. In addition, as described above, although the power supply 38-3 is the voltage variable DC power supply, in order to remove the residual adsorption of the sample 10 for the sample stage 11 after turning-off the switches 38-1 to 38-5, it is preferable that the absolute values in the voltage of the voltage variable DC power supply 38-3 and the voltage variable DC power supply 38-4 are the same in an opposite polarity of plus and minus.

As described above, similar to the first to third embodiments, the analyzer 27 obtains the distance between the optical axis 18 and the outer edge of the sample 10 from a coordinate of an X-Y stage 15 and obtains the setting voltage of the DC power supply 38-3 or the DC power supply 38-5 according to the distance and the irradiation condition of the primary electron beam 22 such as the retarding voltage, etc., by applying the shown sample stage 11 to the CD-SEM shown in FIG. 1 and the controller 29 controls the DC power supply 38-3 or the DC power supply 38-5 as the setting voltage thereof. Therefore, the bending of the primary electron beam 22 is prevented by controlling the potential of the electrode 32-3 or the potential correcting electrode 44-2, thereby obtaining the effect of removing the position deviation even in the case of inspecting the outer peripheral portion of the sample 10. In addition, the electrode 32-3 used to attract the large sample 10 into the sample stage 11 is used as the potential correcting electrode when measuring the small sample 10, thereby making it possible to obtain the foregoing effects using the relatively simple structure.

Fifth Embodiment

Next, a fifth embodiment of the present invention will be described with respect to only portions different from the first to fourth embodiments. In the third embodiment, the two potential correcting electrode 44-1 and potential correcting electrode 44-2 each used when two kinds of samples 10 having different sizes are inspected are installed in the dielectric part 34 of the sample stage 11 that is the electrostatic chuck. On the other hand, in the fifth embodiment, the electrode used to attract the sample 10 into the sample stage 11 is further protruded than the outer edge of the sample 10, thereby making it possible to obtain the effect of preventing the position deviation when the outer peripheral portion of the sample 10 is inspected. Hereinafter, the fifth embodiment will be described with reference to FIG. 11.

FIG. 11(A) is an enlarged view of a structure of the vicinity of the sample stage 11 when the sample 10 having a first size, i.e., the wafer of φ300 as the sample 10 is installed on the sample stage 11. The electrodes 32-1 and 32-2 are each connected with the voltage variable DC power supply 38-1 via the switches 36-1 and 36-2 the voltage variable DC power supply 38-2 similar thereto and turn-on these switches to attract the sample 10 into the sample stage 11. Although the third embodiment makes the outer edge of the electrode 32-2 equal to or smaller than the outer edge of the sample 10 having a first size, i.e., the wafer of φ300, the fifth embodiment forms the diameter of the outer edge of the electrode 32-2 into a diameter of 306 mm to be larger by 3 mm than the sample 10 having a first size, i.e., the sample 10 that is the wafer of φ300. In addition, the DC power supply 38-2 set as the negative voltage is connected with the retarding power supply 26 in series, such that the electrode 32-2 is applied with voltage (negative voltage having a larger absolute value) smaller than the retarding voltage. As a result, the equipotential surface 20-2 is elevated at the outside of the sample 10 through the dielectric part 34 from the electrode 32-2 that is a portion protruded from the sample 10. Therefore, the equipotential surface 20-1 (not shown) of the vicinity of the surface of the sample 10 has the axial symmetry distribution based on the optical axis as a center and the bending of the primary electron beam 22 is removed to prevent the position deviation. In addition, the voltage variable DC power supply 38-2 is set to be voltage suitable for removing the bending of the primary electron beam 22 Further, it is preferable that the voltage variable DC power supply 38-1 is set to be a suitable voltage in order to remove the residual adsorption of the sample 10 for the sample stage 11 after the switch 38-1 and the switch 38-2 are turned-off. In addition, when the sample 10 is the sample 10 having a first size, i.e., the wafer of φ300, since there is no need to apply voltage to the electrode 32-3 and the electrode 32-4, it is preferable to turn-off the switch 38-3 and the switch 38-4.

Next, FIG. 11(B) is an enlarged view of the structure of the vicinity of the sample stage 11 when the sample 10 having a second size, i.e., the wafer of φ450 as the sample 10 is disposed on the sample stage 11. In this case, voltage is applied to the electrode 32-1 and the electrode 32-2 and voltage is also applied to the electrode 32-3 and the electrode 32-4. These electrodes are connected with the voltage variable DC power supply 38-3 and the voltage variable DC power supply 38-4 via the switch 36-3 and the switch 36-4 and turn-on the switch 36-3 and the switch 36-4 to attract the sample 10 into the sample stage 11.

Although the third embodiment makes the outer edge of the electrode 32-4 equal to or smaller than the outer edge of the sample 10 having a second size, i.e., the wafer of φ450, the fifth embodiment forms the diameter of the outer edge of the electrode 32-4 into a diameter of 456 mm to be larger by 3 mm than the sample 10 that is the wafer of φ450. In addition, the DC power supply 38-4 set as the negative voltage is connected with the retarding power supply 26 in series, such that the electrode 32-4 is applied with voltage (negative voltage having a larger absolute value) smaller than the retarding voltage. As a result, the equipotential surface 20-2 is elevated at the outside of the sample 10 through the dielectric part 34 from the electrode 32-4 that is a portion protruded from the sample 10. Therefore, the equipotential surface 20-1 (not shown) of the vicinity of the surface of the sample 10 has the axial symmetry distribution based on the optical axis as a center and the bending of the primary electron beam 22 is removed to prevent the position deviation. In addition, the voltage variable DC power supply 38-4 is set to be voltage suitable for removing the bending of the primary electron beam 22. Further, it is preferable that other voltage variable DC power supplies 38-1 to 38-3 are set to be a suitable voltage in order to remove the residual adsorption of the sample 10 for the sample stage 11 after the switches 38-1 to 38-4 are turned-off.

By applying the above-mentioned sample stage 11 to the CD-SEM shown in FIG. 1, similar to the first to fourth embodiments, the analyzer 27 obtains the distance between the optical axis 18 and the outer edge of the sample 10 from a coordinate of an X-Y stage 15 and obtains the setting voltage of the DC power supply 38-2 or the DC power supply 38-4 according to the distance, the thickness of the sample 10, and the irradiation condition of the primary electron beam 22 such as the retarding voltage sample stage. The controller 29 controls the DC power supply 38-2 or the DC power supply 38-4 base on the setting voltage thereof. Therefore, the potential of the electrode 32-2 or electrode 32-4 is controlled and the bending of the primary electron beam 22 is prevented, thereby obtaining the effect of removing the position deviation even in the case of inspecting the outer peripheral portion of the sample 10.

In addition, the fifth embodiment uses the electrode for attracting the sample 10 into the sample stage 11 in order to prevent the bending of the primary electron beam 22 such that there is no need to install a new potential correcting electrode, thereby making it possible to obtain the foregoing effects using the relatively simple structure.

In addition, since the electrodes 44-1 to 44-4 are at a position lower than the bottom surface of the sample 10 and is covered with the dielectric part 34, there is no risk of interfering or contacting with the sample 10. As a result, the fifth embodiment can obtain an effect of preventing the position deviation when inspecting the outer peripheral portion while effectively installing and attracting the sample 10 on the sample stage 11.

Sixth Embodiment

Next, a sixth embodiment of the present invention will be described with respect to only portions different from the first to fifth embodiments. The third embodiment installs the potential correcting electrodes each used, when two kinds of samples 10 having different sizes are inspected, in the dielectric part 34 of the electrostatic chuck, i.e., the sample stage 11. On the other hand, the sixth embodiment installs the plural concentric potential correcting electrodes corresponding to two kinds of samples 10 having different sizes at the outside of the sample 10, thereby making it possible to densely control the distribution of the equipotential surface 20-2 on the potential correcting electrode 44.

Figure 12:
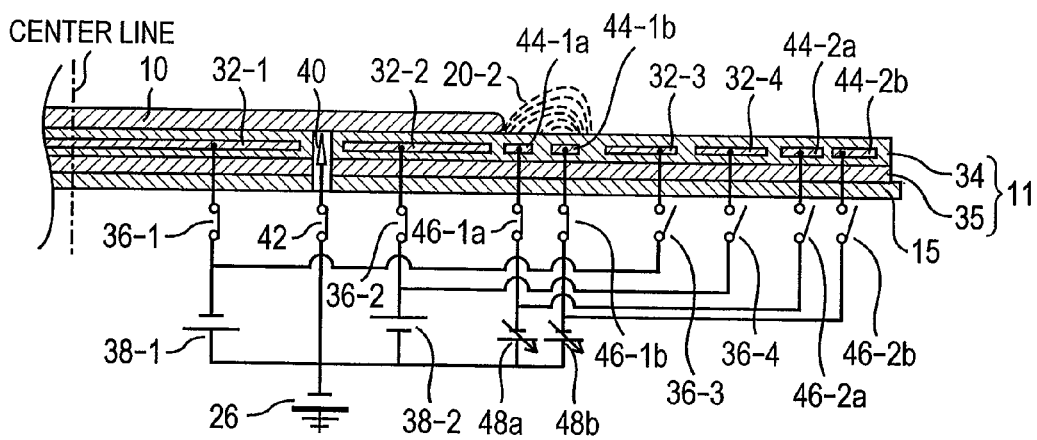
FIG. 12 is a side cross-sectional view showing a structure of a sample stage of a CD-SEM used in a sixth embodiment.
Figure 12:
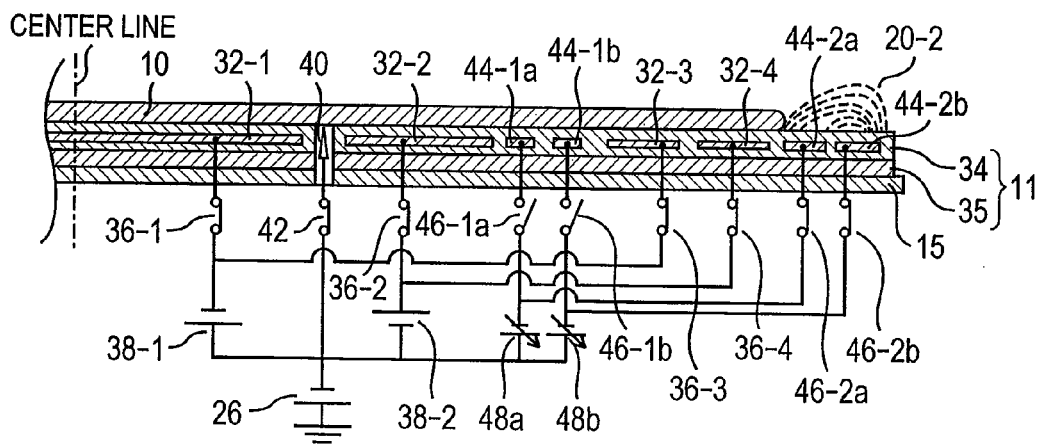
Figure 13:
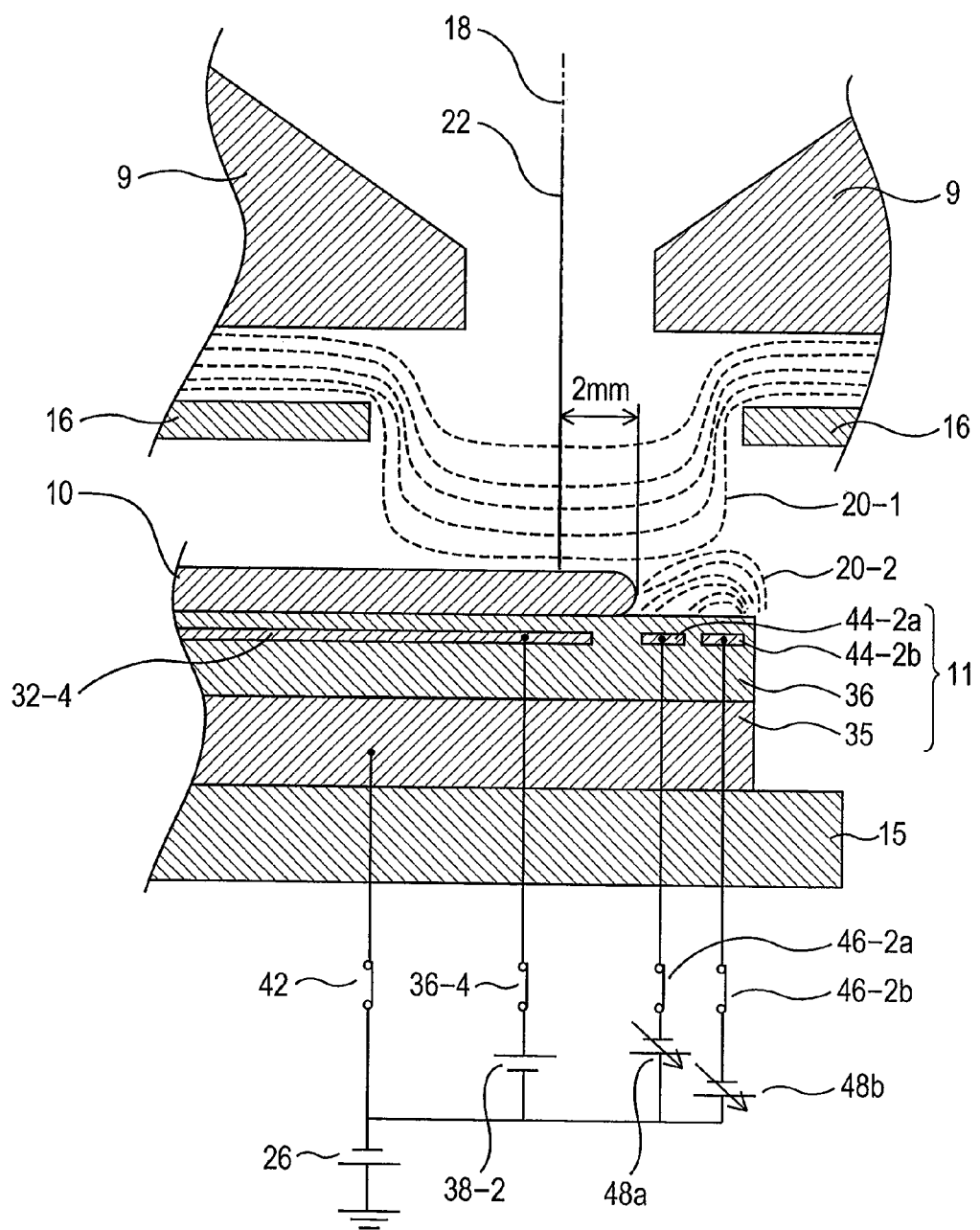
FIG. 13 is an enlarged side cross-sectional view of an objective lens and a shield electrode of a CD-SEM and a vicinity of a sample stage used in the sixth embodiment.
Figure 14:
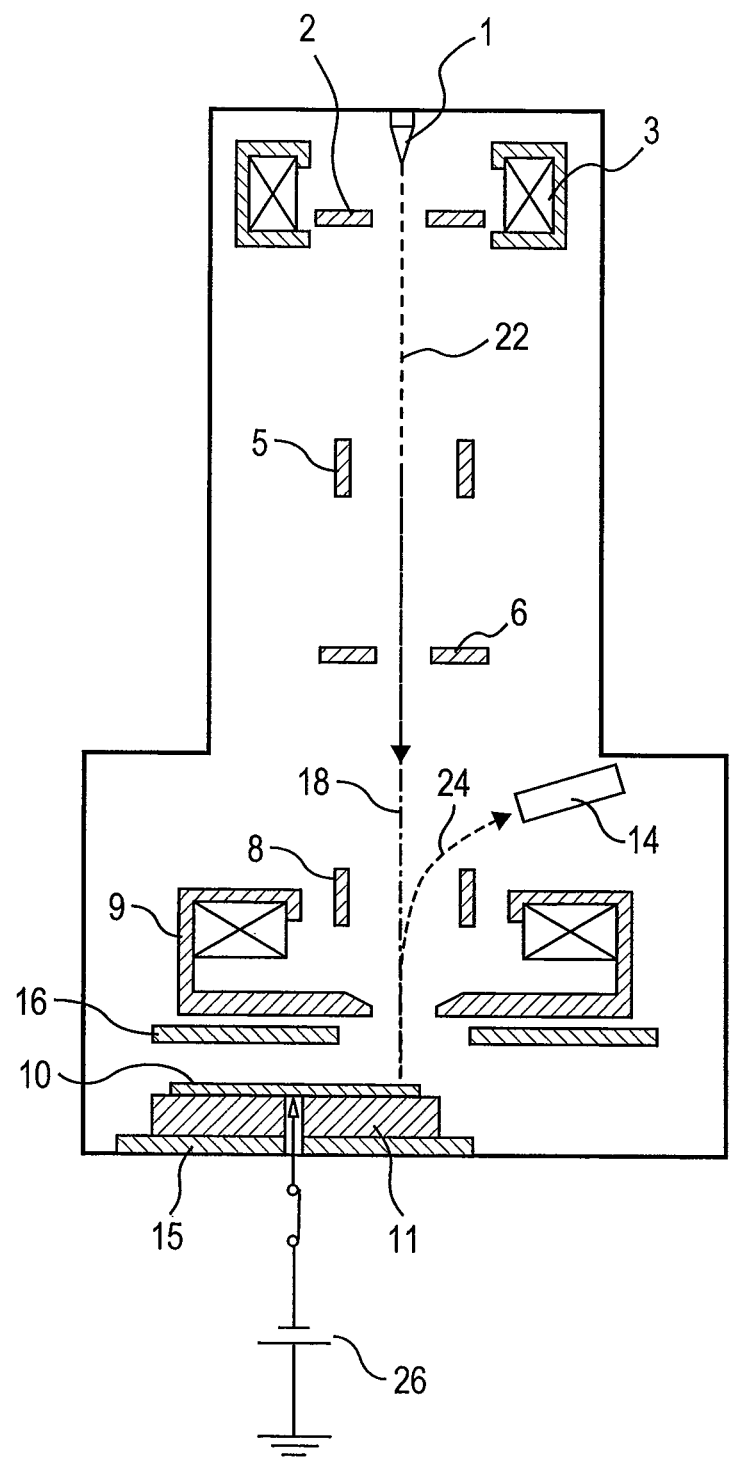
FIG. 14 is a side cross-sectional view showing an example of a structure of a CD-SEM according to the related art.

FIGS. 12(A) and 12(B) each are a diagram showing a configuration of the vicinity of the sample stage 11 when the sample 10 having a first size, i.e., the wafer of φ300 as the sample 10 is installed on the sample stage 11 and when the sample 10 having a second size, i.e., the wafer of φ450 as the sample 10 is installed on the sample stage 11, respectively. In addition, FIG. 13 is a diagram showing a configuration of the vicinity of the sample stage 11, the shield electrode 16, and the objective lens 9 when the sample 10 of a second size, i.e., the wafer of φ450 as the sample 10 is installed on the sample stage 11.

As shown in FIG. 12(A), the electrodes 32-1 and 32-2 are each connected with the voltage variable DC power supply 38-1 via the switches 36-1 and the voltage variable DC power supply 38-2 similar thereto and turn-on these switches to attract the sample 10 into the sample stage 11. In the third embodiment, one ring-shaped potential correcting electrode 44-1 is installed in the dielectric part 34 and at the outside of the electrode 32-2, while in the sixth embodiment, the ring-shaped potential correcting electrode 44-1a is installed at the outside of the electrode 32-2 and the ring-shaped potential correcting electrode 44-1b is installed at the outside thereof. In addition, the potential correcting electrode 44-1a and the potential correcting electrode 44-1b are connected with the voltage variable DC power supply 48a and the voltage variable DC power supply 48b via the switch 46-1a and the switch 46-1b and turn-on these switches to apply the negative voltage to the potential correcting electrode 44-1a and the potential correcting electrode 44-1b. In addition, the DC power supply 48a and the DC power supply 48b are connected to the retarding power supply 26 in series, such that they are maintained at a potential (negative potential having a larger absolute value) lower than the sample 10. Therefore, the equipotential surface 20-2 is elevated at the outside of the sample 10 or the vicinity of the potential correcting electrode 44-1a and the potential correcting electrode 44-1b. In addition, the DC power supply 48b is maintained at voltage (negative voltage having a larger absolute voltage) lower than the DC power supply 48a, such that the distribution of the equipotential surface 20-2 elevated at the outside of the sample 10 may be higher than at the outside as shown in FIG. 12(A). Further, to the contrary, the DC power supply 48b has voltage (a negative voltage or a positive voltage having a smaller absolute value) higher than that of the DC power supply 48a, such that the distribution of the equipotential surface 20-2 may be further elevated at the inside. As a result, the distribution of the equipotential surface 20-2 may be controlled to be dense by controlling the voltage of the DC power supply 48a and the DC power supply 48b.

Further, when the sample 10 having a first size, i.e., the wafer of φ300 as the sample 10 is installed on the sample stage 11, since there is no need to apply voltage to the electrode 32-3, the electrode 32-4, the potential correcting electrode 44-2a and the potential correcting electrode 44-2b, it is preferable to turn-off all of the potential correcting electrode 44-2b, the switch 36-3, the switch 36-4, the switch 46-2a, and the switch 46-2b connected thereto.

Next, as shown FIG. 12(B), when the sample 10 having a second size, i.e., the wafer of φ450 as the sample 10 is installed on the sample stage 11, voltage is applied to the electrode 32-1 and the electrode 32-2 and voltage is also applied to the electrode 32-3 and the electrode 32-4. These electrodes are connected with the DC power supply 38-1 and the DC power supply 38-2 via the switch 36-3 and the switch 36-4 and these switches 36-3 and switch 36-4 are turned-on to attract the sample 10 into the sample stage 11.

In the third embodiment, one ring-shaped potential correcting electrode 44-2 is installed in the dielectric part 34 and at the outside of the electrode 32-2, while in the sixth embodiment, the ring-shaped potential correcting electrode 44-2a is installed at the outside of the electrode 32-4 and the ring-shaped potential correcting electrode 44-2b is installed at the outside thereof. In addition, the potential correcting electrode 44-2a and the potential correcting electrode 44-2b are connected with the voltage variable DC power supply 48a and the voltage variable DC power supply 48*b* via the switch 46-2*a* and the switch 46-2*b* and turns-on these switches to apply the negative voltage to the potential correcting electrode 44-2*a* and the potential correcting electrode 44-2*b*. In addition, the DC power supply 48*a* and the DC power supply 48*b* are connected to the retarding power supply 26 in series, such that they are maintained at a potential (negative potential having a larger absolute value) lower than the sample 10. Therefore, the equipotential surface 20-2 is elevated at the outside of the sample 10 or the vicinity of the potential correcting electrode 44-2*a* and the potential correcting electrode 44-2*b*. In addition, the DC power supply 48*b* is maintained at voltage (negative voltage having a larger absolute voltage) lower than the DC power supply 48*a*, such that the distribution of the equipotential surface 20-2 elevated at the outside of the sample 10 may be higher than at the outside as shown in FIG. 12(B). Further, to the contrary, the DC power supply 48*b* has voltage (a negative voltage or a positive voltage having a smaller absolute value) higher than that of the DC power supply 48*a*, such that the distribution of the equipotential surface 20-2 may be further elevated at the inside. As a result, the distribution of the equipotential surface 20-2 elevated at the outside of the sample 10 may be controlled to be dense by controlling the voltage of the DC power supply 48*a* and the DC power supply 48*b*.

In the sixth embodiment, as shown in FIG. 13, the distribution of the equipotential surface 20-2 is further elevated at the outside by making the voltage (a negative voltage having a larger absolute value) of the DC power supply 48*b* lower than that of the DC power supply 48*a*. As a result, the equipotential surface 20-1 of the vicinity of the surface of the sample 10 becomes the axial symmetry distribution based on the optical axis as a center and the bending of the primary electron beam 22 is removed, thereby preventing the position deviation.

As described above, similar to the first to fifth embodiments, the analyzer 27 obtains the distance between the optical axis 18 and the outer edge of the sample 10 from a coordinate of an X-Y stage 15 and obtains the setting voltage of the DC power supply 48*a* or the DC power supply 48*b* according to the distance, the thickness, and the irradiation condition of the primary electron beam 22 such as the retarding voltage, etc., by applying the shown sample stage 11 to the CD-SEM shown in FIG. 1 and the controller 29 controls the DC power supply 48*a* or the DC power supply 48*b* as the setting voltage thereof. Therefore, the sixth embodiment controls the potential of the potential correcting electrode 44-1*a* or the potential correcting electrode 44-1*b* or the potential correcting electrode 44-2*a* or the potential correcting electrode 44-2*b* to prevent the bending of the primary electron beam 22, thereby making it possible to remove the position deviation even in the case of inspecting the outer peripheral portion of the sample 10.

In addition, it may make the axial symmetry of the distribution of the equipotential surface 20-1 of the vicinity of the surface of the sample 10 more excellent by densely controlling the distribution of the equipotential surface 20-2 elevated at the outside of the sample 10.

Further, when the sample 10 having a second size, i.e., the wafer of φ450 as the sample 10 is installed on the sample stage 11, since there is no need to apply voltage to the potential correcting electrode 44-1*a* and the potential correcting electrode 44-1*b*, it is preferable to turn-off the switch 46-1*a* and the switch 46-1*b* connected thereto.

Therefore, even when the outer peripheral portion of the sample 10 is inspected, the bending of the primary electron beam 22 is removed, thereby preventing the position deviation.

Seventh Embodiment

Next, a seventh embodiment will be described. In the fifth embodiment, the electrode used to attract the sample 10 into the sample stage 11 is further protruded than the outer edge of the sample 10, thereby making it possible to obtain the effect of preventing the position deviation when the outer peripheral portion of the sample 10 is inspected. However, the protruded length of the electrode is not described. The seventh embodiment will describe the length more protruded than the outer edge of the sample 10 of the electrode based on the review results by the Inventors.

Hereinafter, only the difference between the seventh embodiment and the first to sixth embodiments will be described with reference to FIG. 11 and FIGS. 16 to 18.

Figure 11:
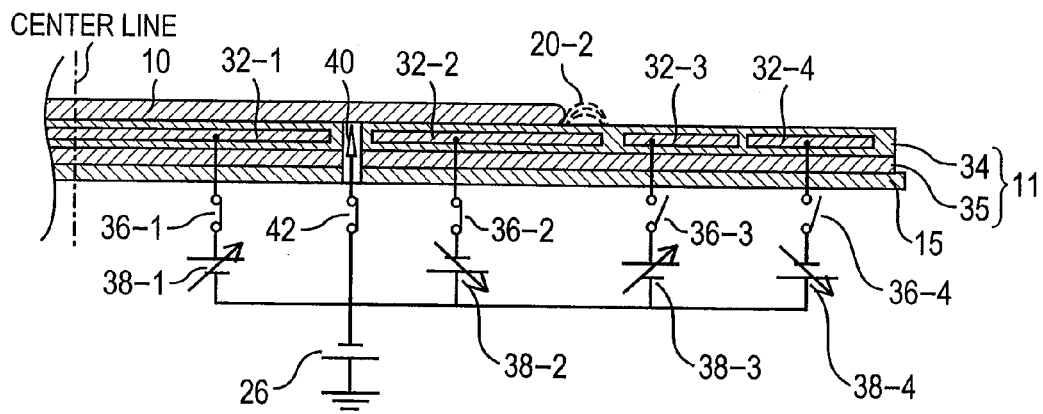
FIG. 11 is a side cross-sectional view showing a structure of a sample stage of a CD-SEM used in a fifth embodiment.
Figure 11:
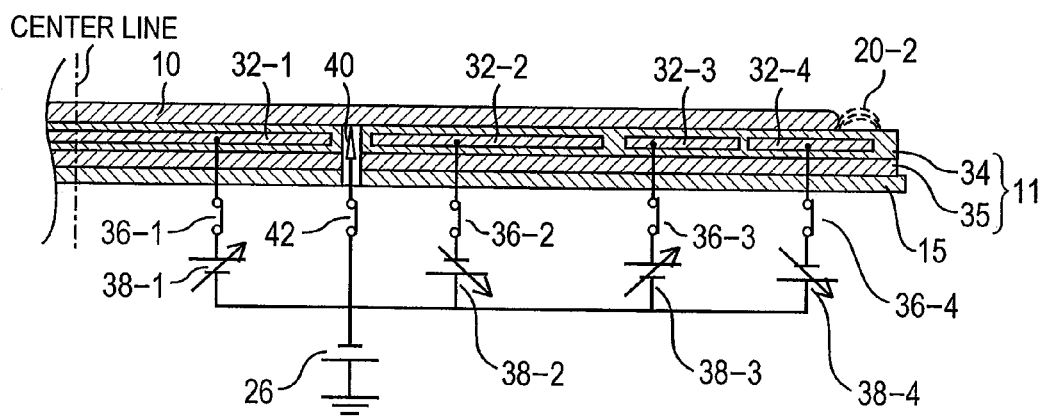
Figure 16:
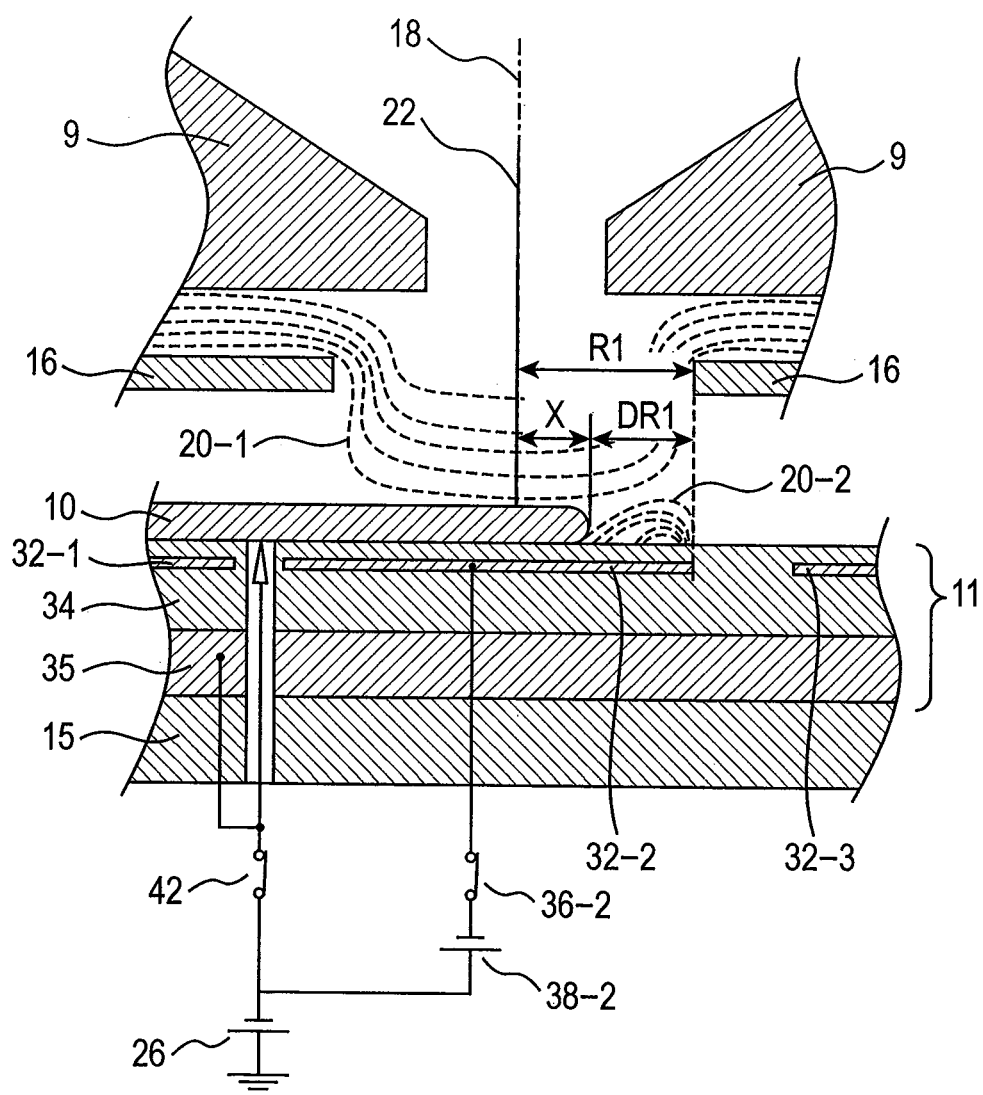
FIG. 16 is a side cross-sectional view showing a structure of a sample stage of a CD-SEM used in a seventh embodiment.
Figure 17:
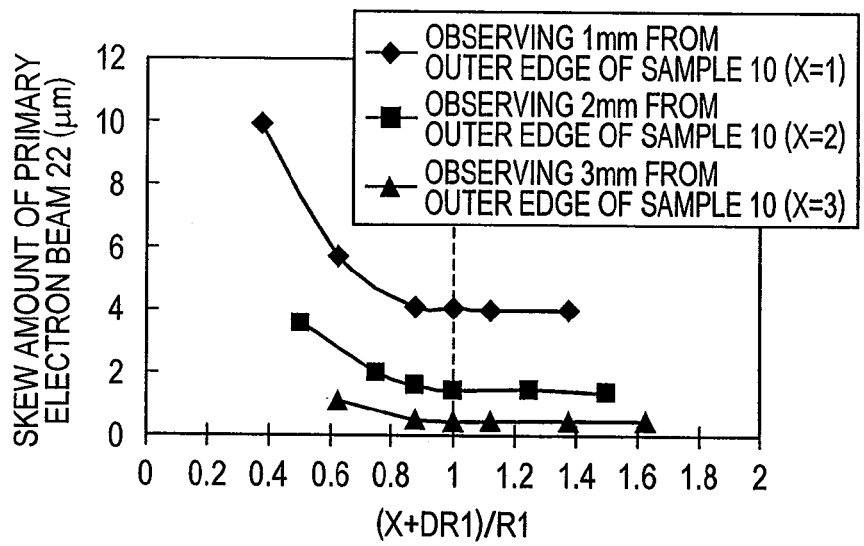
FIG. 17 is two graphs showing a relation among an amount that an electrode in the sample stage of the CD-SEM used in the seventh embodiment is protruded from the outer edge of the sample, a observation position of a sample, a hole radius of a shield electrode, and a bending amount of a primary electron beam.
Figure 17:
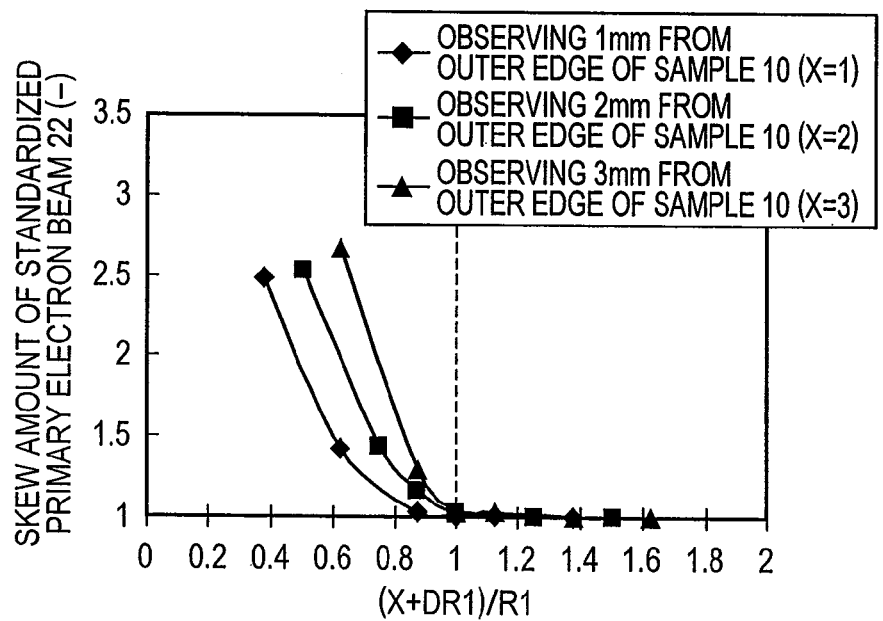
Figure 18:
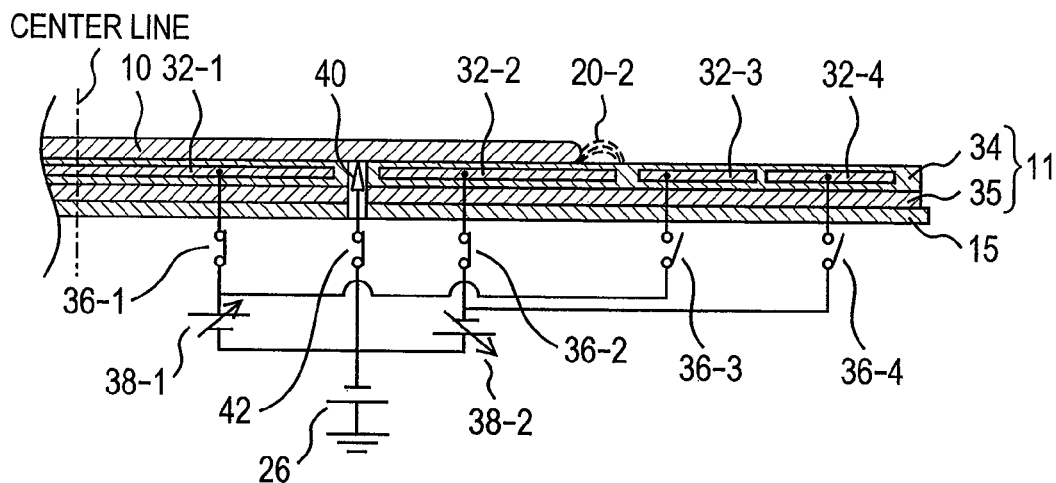
FIG. 18 is a side cross-sectional view showing a structure of the sample stage of the CD-SEM used in the seventh embodiment.
Figure 18:
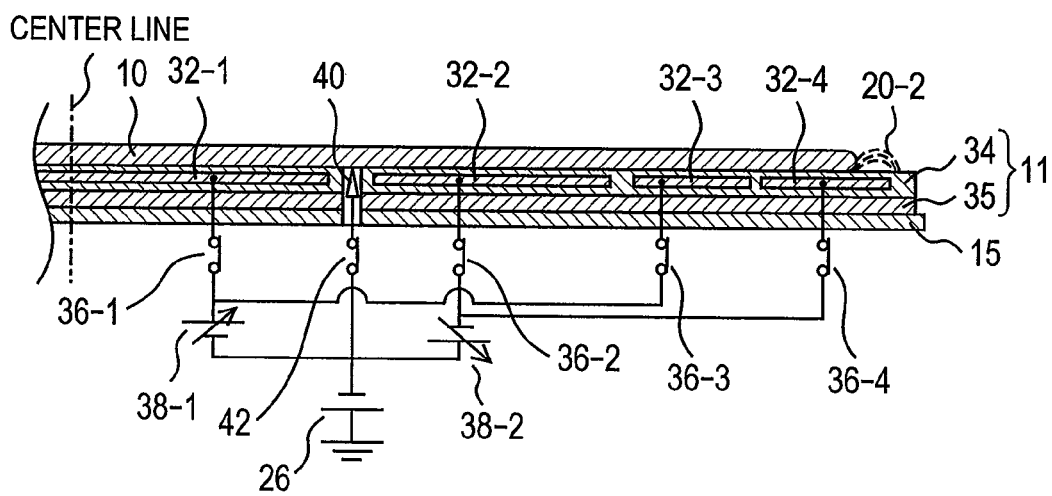

FIG. 11 is a diagram used in the description of the fifth embodiment and is an enlarged cross-sectional view of the vicinity of the sample stage 11 used in the CD-SEM of the embodiment. Further, FIG. 16 shows components of the vicinity of the sample stage 11, the shield electrode 16 at the same potential as the sample 10, and an objective lens 9 when the wafer of φ300 as the sample 10 is installed on the sample stage 11, in particular, components when a position of 1 mm inside from the outer edge of the sample 10 is inspected. Further, FIG. 17 is a graph showing the relationship between the amount protruded from the sample 10 of the electrode 32-2 and the bending amount of the primary electron beam 22. In addition, FIG. 18 is an enlarged cross-sectional view of the vicinity of the sample stage 11 used in the CD-SEM of the seventh embodiment and shows the configuration of the DC power supply changed from FIG. 11. As can be clearly appreciated from FIG. 11, the DC power supply 38-1 is used with the DC power supply 38-3 of FIG. 1 and the DC power supply 38-2 is used with the DC power supply 38-4.

Hereinafter, the seventh exemplary will be described with reference to each drawing. As described above, FIG. 11(A) is an enlarged view of a configuration of the vicinity of the sample stage 11 when the sample 10 having a first size, i.e., the wafer of φ300 as the sample 10 is installed on the sample stage 11. Similar to the fifth embodiment, the seventh embodiment configures the diameter of the outer edge of the electrode 32-2 to be larger than that of the sample 10, i.e., the wafer of φ300, the DC power supply 38-2 connected thereto is set to the negative voltage and is connected with the retarding power 26 in series, such that the voltage (a negative voltage having a larger absolute value) lower than the retarding voltage is applied to the electrode 32-2. As a result, the equipotential surface 20-2 is elevated at the outside of the sample 10 through the dielectric part 34 from the electrode 32-2 that is a portion protruded from the sample 10. Therefore, as shown in FIG. 16, the equipotential surface 20-1 of the vicinity of the surface of the sample 10 has the axial symmetry distribution based on the optical axis as a center and the bending of the primary electron beam 22 is removed to prevent the position deviation. In addition, when the sample 10 is the sample 10 having a first size, i.e., the wafer of φ300, since there is no need to apply voltage to the electrode 32-3 and the electrode 32-4, it is preferable to turn-off the switch 36-3 and the switch 36-4.

Further, as shown in FIG. 16, when the outer peripheral part of the sample 10, i.e., the wafer of φ300, is inspected by applying the configuration shown in the seventh embodiment, the measurement position, i.e., the distance X between the optical axis and the outer edge of the sample 10, the length DR1 protruded from the outer edge of the sample 10 (that is, the difference between the radius of the outer edge of the electrode 32-2 and the radius of the sample 10), the radius R1 of the hole of the shield electrode 16 formed in the approximate concentric shape around the optical axis have an effect on the distribution of the equipotential surface 20-1, which has an effect on the bending amount of the primary electron beam 22, which is found by the evaluation of the Inventors.

As described above, in order to elevate the equipotential surface 20-1 falling to the hole of the shield electrode 16 to reduce the bending amount of the primary electron beam 22, there is a need to elevate the equipotential surface 20-2 from the electrode 32-2. In this case, as the DR1 is wide, the region in which the equipotential surface 20-2 is elevated is wide, thereby strongly elevating the equipotential surface 20-2. However, since the equipotential surface 20-1 falling to the hole of the shield electrode 16 is not present in the outside region from the hole of the shield electrode 16, the effect of elevating the equipotential surface 20-2 is not large even though the DR1 is long so that the outer edge of the electrode 32-2 becomes the outside of the hole of the shield electrode 16 rather than the edge thereof. That is, when the distance X+DR1 from the optical axis 18 to the outer edge of the electrode 32-2 is R1 or less, as the DR1 becomes long, the bending amount of the primary electron beam 22 may be reduced but when the X+DR1 is R1 or more, the effect of reducing the bending amount of the primary electron beam 22 is saturated.

Next, when the DR1 is changed, the results of the bending amount of the primary electron beam 22 evaluated by the inventors are shown in FIG. 17. FIG. 17(A) is a graph showing the relationship among the amount DR1 protruded from the electrode 32-2, the distance X between the optical axis 18 and the outer edge of the sample 10, and the bending amount of the primary electron beam 22, when the retarding voltage from the retarding power supply 26 is −2200V, the potential of the objective lens 9 is +5000V, and a voltage of adding −800V to the retarding voltage from the DC power supply 38-2, that is, −3000V is applied to the electrode 32-2. A horizontal axis of the graph represents a ratio of the hole radius R1 of the shield electrode 16 to the sum of the amount DR1 protruded from the electrode 32-2 and the distance X between the optical axis 18 and the outer edge of the sample 10, that is, (DR1+X)/R1 and the vertical axis thereof represents the bending amount of the primary electron beam 22. It can be appreciated from FIG. 17(A) that the bending amount of the primary electron beam 22 is small as the (DR1+X)/R1 is large, even though the observation position is any of 1 to 3 mm inside from the outer edge of the sample 10, but it is converged to any value in the region where the (DR1+X)/R1 is 1 or more.

Similar to FIG. 17(A), FIG. 17(B) is a graph showing the relationship between the amount DR1 protruded from the electrode 32-2 and the bending amount of the primary electron beam 22 when the observation position is 1 to 3 mm inside from the outer edge of the sample 10. The horizontal axis is the same as FIG. 17(A) and the vertical axis standardizes the bending amount of the primary electron beam 22 shown in FIG. 17(A) as a saturated value of the bending amount of the primary electron beam 22 at the observation positions.

It can be appreciated from FIGS. 17A and 17B that the standardized bending amount of the primary electron beam 22 is converged to about 1 in the region where the (DR1+X)/R1 is 1 or more even in any cases. It is possible to reduce the bending amount of the primary electron beam 22 by making the amount DR1 protruded from the electrode 32-2 large from these results. To this end, it is effective that sum of the amount DR1 protruded from the electrode 32-2 and the distance X between the optical axis 18 and the outer edge of the sample 10 is the radius R1 or more of the hole of the shield electrode 16.

Figure 5:
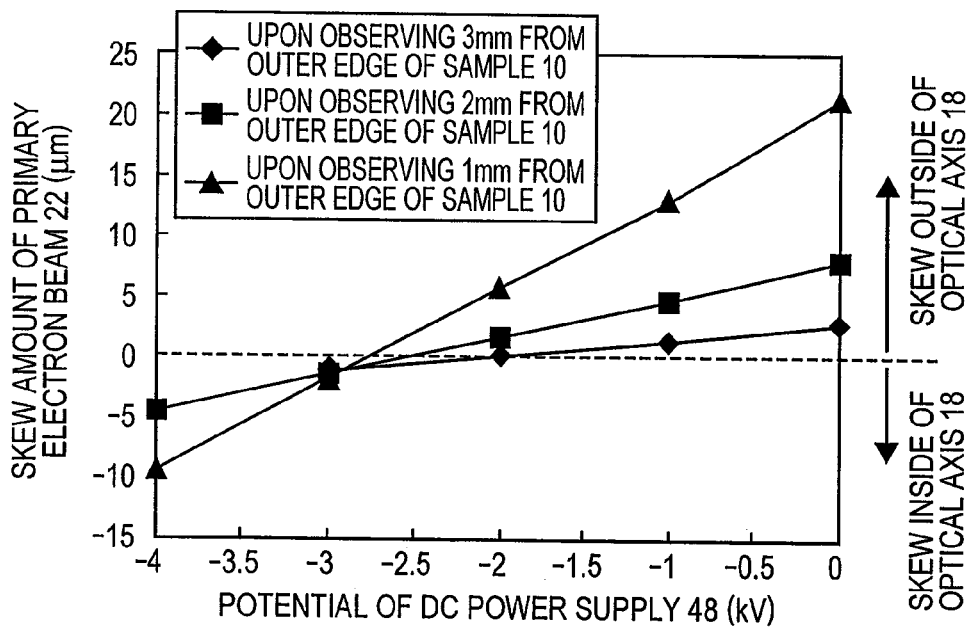
FIG. 5 is a diagram showing a relationship between a potential of a DC power supply applied to a potential correcting electrode of a sample stage used in the CD-SEM used in the first embodiment and a bending amount of primary electron and a relationship between voltage of a DC power supply applied to a potential correcting electrode of a sample stage and a distance between an optical axis and an outer edge of a sample.
Figure 5:
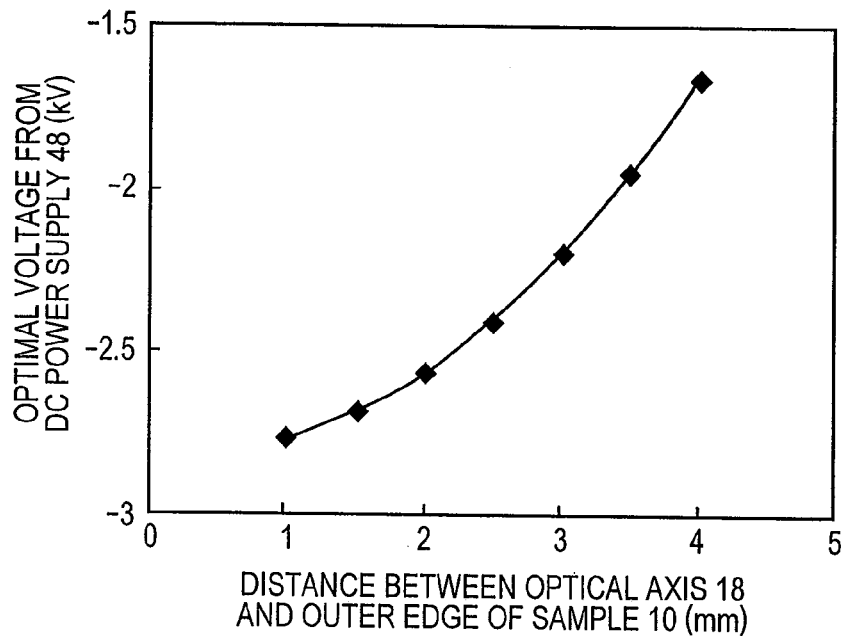

Further, similar to the graph of FIG. 5 used in the first exemplary embodiment, the seventh embodiment can reduce the bending amount of the primary electron beam 22 by lowering the voltage of the DC power supply 38-2 (increasing the absolute value of the negative voltage). In this case, it is possible to the bending amount of the primary electron beam 22 at the voltage of the DC power supply 38-2 smaller than the absolute value by making the (DR1+X)/R1 into 1 or more. When the absolute value of the output voltage of the DC power supply 38-2 is large, the cost of necessary DC power supply is problem. As a result, the reduction of the absolute value of the voltage of the DC power supply 38-2 leads to the cost reduction. For this reason, it is important to widen the amount DR1 so that the (DR1+X)/R1 become 1 or more.

Next, as shown in FIG. 11(B), when the wafer of ϕ450 is installed on the sample stage 11 as the sample 10 having a second size, voltage is applied to the electrode 32-1 and the electrode 32-2, respectively, by the DC power supply 38-1 and the DC power supply 38-2. Further, voltage is applied to the ring-shaped electrode 32-3 and the ring-shaped electrode 32-4. These electrodes are each connected with the DC power supply 38-3 and the DC power supply 38-4 via the switch 36-3 and the switch 36-4, and turn-on the switch 36-3 and the switch 36-4 to attract the sample 10 into the sample stage 11. Even in this case, when the diameter of the outer edge of the electrode 32-4 is configured to be larger than the diameter of the sample 10, i.e., the wafer of ϕ450 and the DC power supply 38-4 connected to the retarding power supply 26 in series is set to the negative voltage, such that the voltage (a negative voltage having a larger absolute value) lower than the retarding voltage is applied to the electrode 32-4.

As a result, the equipotential surface 20-2 is elevated at the outside of the sample 10 through the dielectric part 34 from the electrode 32-4 that is a portion protruded from the sample 10. Therefore, the equipotential surface 20-1 (not shown) of the vicinity of the surface of the sample 10 has the axial symmetry distribution based on the optical axis 18 as a center and the bending of the primary electron beam 22 becomes small to prevent the position deviation. Even in this case, similar to the sample 10, i.e., the wafer of ϕ300, the sum of the amount DR1 protruded from the electrode 32-4 protruded from the wafer of ϕ450 and the distance X between the optical axis 18 and the outer edge of the sample 10 is set to the hole radius R1 or more of the shield electrode 16, i.e., the (DR1+X)/R1 is set to 1 or more, such that the bending amount of the primary electron beam 22 can be effectively reduced by the negative voltage of the DC power supply 38-2 having a smaller absolute value, thereby making it possible to prevent the position deviation.

In addition, the DC power supply 38-2 is the voltage fixing DC power supply in the above-mentioned configuration, but the present invention is not limited thereto. Therefore, it is preferable that the DC power supply is variable. In this case, when the wafer of ϕ300 as the sample 10 having a first size or the wafer of ϕ450 as the sample 10 having a second size is installed on the sample stage 11, the distribution of the equipotential surface 20-2 is optimized by controlling the voltage of the DC power supply 38-2 or the DC power supply 38-4, respectively, thereby making it possible to more effectively reduce the bending of the primary electron beam 22.

As described above, similar to the first to sixth embodiments, the analyzer 27 obtains the distance between the optical axis 18 and the outer edge of the sample 10 from a coordinate of an X-Y stage 15 and obtains the setting voltage of the DC power supply 38-2 or the DC power supply 38-4 according to the distance, the thickness, and the irradiation condition of the primary electron beam 22 such as the retarding voltage, etc., by applying the shown sample stage 11 to the CD-SEM shown in FIG. 1 and the controller 29 controls the DC power supply 38-2 or the DC power supply 38-4 as the setting voltage thereof. Therefore, the bending of the primary electron beam 22 is prevented by controlling the potential of the electrode 32-2 or the potential correcting electrode 32-4, thereby obtaining the effect of removing the position deviation even in the case of inspecting the outer peripheral portion of the sample 10.

In addition, the seventh embodiment uses the electrode for attracting the sample 10 into the sample stage 11 in order to prevent the bending of the primary electron beam 22 such that there is no need to install a new potential correcting electrode, thereby making it possible to obtain the foregoing effects using the relatively simple structure. In addition, since the electrodes 32-1 to 32-4 are at a position lower than the bottom surface of the sample 10 and is covered with the dielectric part 34, there is no risk of interfering or contacting with the sample 10. As a result, the seventh exemplary embodiment can obtain an effect of preventing the position deviation when inspecting the outer peripheral portion while effectively installing and attracting the sample 10 on the sample stage 11.

In addition, in the seventh embodiment, as shown in FIG. 11, although four DC power suppliers 38-1 to 38-4 as the power supply applying voltage to the electrodes 32-1 to 32-4 are used but the seventh embodiment is not limited to the above-mentioned number. As described above, two DC power suppliers 38-1 and 38-2 may be used as shown in FIG. 18. FIG. 18 has the same configuration as the sample stage 11 shown in FIG. 11, but the configuration of the power supply applying voltage to the electrodes 32-1 to 32-4 may be changed.

FIG. 18(A) is an enlarged view of a configuration of the vicinity of the sample stage 11 when the sample 10 having a first size, i.e., the wafer of ϕ300 as the sample 10 is installed on the sample stage 11. The DC power supply 38-1 and the DC power supply 38-2 are each connected with the disc-shaped electrode 32-1 and the ring-shaped electrode 32-2, respectively, via the switch 36-1 and the switch 36-2 and turn-on the switch 36-1 and the switch 36-2 to attract the sample 10 into the sample stage 11. FIG. 18(B) is an enlarged view of a configuration of the vicinity of the sample stage 11 when the sample 10 having a second size, i.e., the wafer of ϕ450 as the sample 10 is installed on the sample stage 11. By turning-on the switches 36-1 to 36-4, voltage is applied to the electrode 32-1 and the electrode 32-3 by the DC power supply 38-1 set as the positive voltage and to the electrode 32-2 and the electrode 32-4 by the DC power supply 38-2 set as the negative voltage, thereby attracting the sample 10 into the sample stage 11.

Therefore, the equipotential surface 20-2 is elevated at the outside of the sample 10 through the dielectric part 34 from the electrode 32-2 or the electrode 32-4 of a portion protruded from the sample 10 and the equipotential surface 20-1 (not shown) of the vicinity of the surface of the sample 10 becomes the axial symmetry distribution based on the optical axis and the bending of the primary electron beam 22 is removed, thereby preventing the position deviation.

Further, in order to rapidly carry the sample 10 after the measurement ends by the CD-SEM, it is necessary to weaken the residual adsorption force of the sample stage 11 for the sample 10 after the switches 36-1 to 36-4 are turned-off. To this end, the effect that the charge amount accumulated in the attracting part in the region of the positive electrode and the attracting part in the region of the negative electrode becomes the same is disclosed in Japanese Patent Application Laid-Open Publication No. H10 (1998)-150100.

For this reason, in the seventh embodiment, the radius of the electrode 32-1 is a disc of 104 mm, the inner radius of the electrode 32-2 is 108 mm, the outer radius of a ring is 159 mm, the inner radius of the electrode 32-3 is 163 mm, the outer radius of a ring is 198 mm, the inner radius of the electrode 32-4 is 202 mm, and a ring of an outer radius is 234 mm. In addition, the hole radius R1 of the shield electrode 16 is 10 mm, the outermost observation position is the 1 mm inside from the outer edge thereof, that is, the distance X between the optical axis 18 and the outer edge of the sample 10 is minimally 1 mm. In this configuration, when the sample 10 is the wafer of ϕ300, the attracting part in the region of the electrode applied with the positive voltage is a disc of radius 104 mm and the attracting part in the region of the electrode having a negative voltage is a ring having the inner radius 108 mm and the outer radius 150 mm and the area of the attracting part of the positive and negative poles is approximately the same to make the absolute value of voltage applied to the electrode of each pole the same, thereby weakening the residual adsorption force of the sample stage 11 for the sample 10. In addition, when the distance X between the optical axis 18 and the outer edge of the sample 10 is 1 mm or more, the ratio (DR1+X)/R1 of the sum of the X and the hole radius R1 of the shield electrode 16 and the amount DR1 protruded from the electrode 32-2 is 1 or more and the bending of the primary electron beam 22 can be reduced at the negative voltage of the DC power supply 38-2 having a smaller absolute value.

Further, when the sample 10 is the wafer of ϕ450, the attracting part in the region of the positive electrode is the disc of radius 104 mm and the ring of inner radius 163 mm and outer radius 198 mm and the attracting part in the region of the electrode having a negative voltage is the ring of inner radius 108 mm and outer radius 159 mm and the ring of inner radius 202 mm and outer radius 225 mm and the area of the attracting part having the positive and negative poles are approximately the same to make the absolute values of voltage of the DC power suppliers 38-1 to 38-4 the same, thereby making it possible to weaken the residual adsorption force of the sample stage 11 for the sample 10. Further, when the distance X between the optical axis 18 and the outer edge of the sample 10 is 1 mm or more, the ratio (DR1+X)/R1 of the sum of X and the hole radius R1 of the shield electrode 16 to the amount DR1 protruded from the electrode 32-2 is 1 or more and the bending of the primary electron beam 22 can be reduced by the negative voltage of the DC power supply 38-2 having a smaller absolute value.

In the case of the seventh embodiment, the hole radius R1 of the shield electrode 16 is 10 mm, the outermost observation position is the 1 mm inside of the sample 10 from the outer edge thereof, that is, the distance X between the optical axis 18 and the outer edge of the sample 10 is minimally 1 mm. In this case, the amount DR1 protruded from the electrode 32-2 or the electrode 32-4 protruded from the sample 10 is 9 mm or more, such that the bending of the primary electron beam 22 can be reduced at the negative voltage of the DC power supply 38-2 having a smaller absolute value. Further, the minimum value of the distance X between the optical axis 18 and the outer edge of the sample 10 is 0 mm, the amount DR1 protruded from the electrode 32-2 or the electrode 32-4 is set to be larger than the hole radius R1 of the shield electrode 16, such that the bending of the primary electron beam 22 can be reduced at the negative voltage of the DC power supply 38-2 having a smaller absolute value even when the vicinity of the outer edge of the sample 10 is observed.

Further, in the seventh embodiment, the electrodes 32-1 to 32-4 are formed to have the above mentioned dimension, but are not limited thereto.

Further, in the seventh embodiment, in order to make the bending of the primary electron beam 22 at the negative voltage of the DC power supply 38-2 having a smaller absolute value small, the amount DR1 protruded from the electrode 32-2 is wide in order to make the (DR1+X)/R1 larger than 1. On the other hand, even though the protruded amount DR1 is long so that the (DR1+X)/R1 is 1 or more, since the bending amount of the primary electron beam 22 is not changed, the upper limit of the protruded amount DR1 is not limited in terms of the bending amount of the primary electron beam 22. However, in order to measure the sample 10 having two or more kinds of sizes, it is necessary that the protruded amount DR1 is the difference or less between the radius of the sample 10 having the maximum size and the radius of the sample 10 having the minimum size.

Eighth Embodiment

Next, an eighth embodiment will be described. In the seventh embodiment, the electrode used to attract the sample 10 into the sample stage 11 is further protruded than the outer edge of the sample 10, thereby making it possible to obtain the effect of preventing the position deviation when the outer peripheral portion of the sample 10 is inspected. In the seventh embodiment, four sheets of electrodes 32-1 to 32-4 are installed in the dielectric part 34. On the other hand, the eighth embodiment uses three sheets of electrodes to meet the inspection of the sample having different sizes, thereby making it possible to prevent the bending of the primary electron beam 22 when the inspection of the outer peripheral portion of the sample 10 is performed. Hereinafter, only the difference between the eighth embodiment and the first to seventh embodiments will be described with reference to FIGS. 19 and 20.

Figure 19:
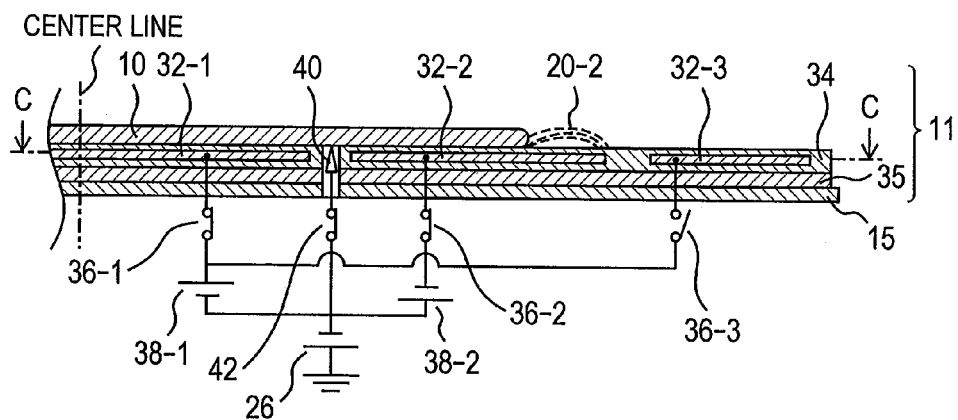
FIG. 19 is a side cross-sectional view showing a structure of a sample stage of a CD-SEM used in an eighth embodiment.
Figure 19:
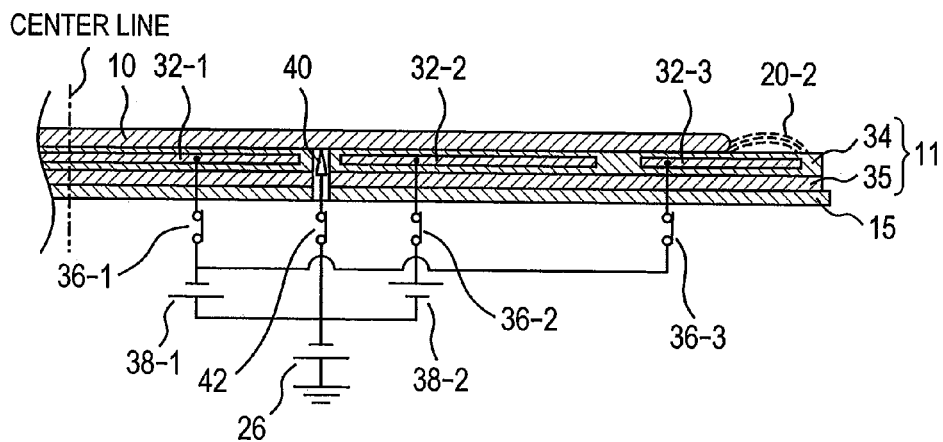
Figure 20:
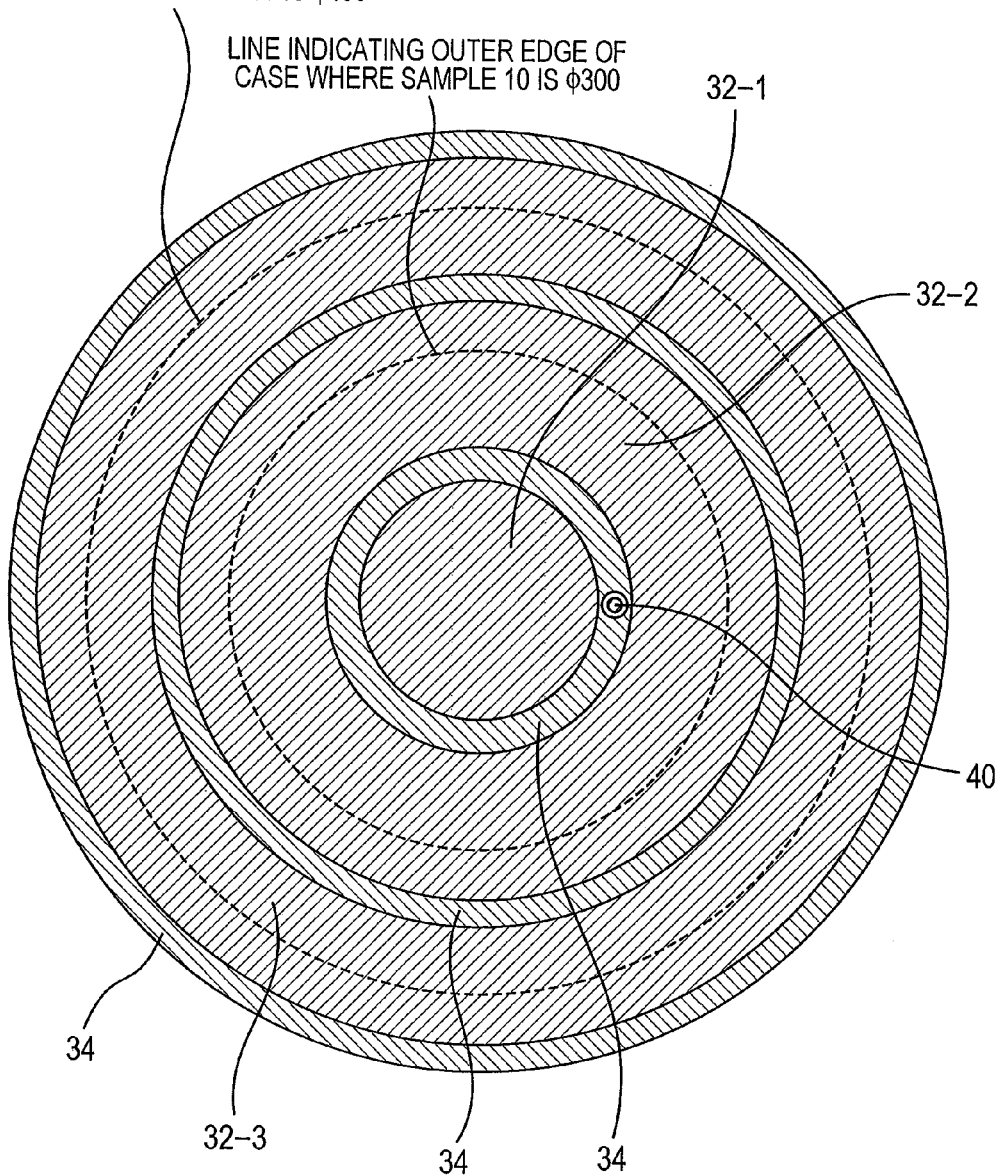
FIG. 20 is a diagram showing a sample stage of a CD-SEM used in the eighth embodiment and is a cross-sectional view taken along line C-C of FIG. 19.

FIG. 19 is an enlarged diagram of the vicinity of the sample stage 11 on a movement mechanism, i.e., the stage 15 used in a CD-SEM of the eighth embodiment. Herein, FIG. 19(A) is a diagram showing the configuration of the vicinity of the sample stage 11 when the sample 10 having a first size, i.e., the wafer of φ300 as the sample 10 installed on the sample stage 11 and the sample 10 having a second size, i.e., the wafer of φ450 as the sample 10 are installed on the sample stage 11, respectively. In addition, FIG. 20 is a diagram showing a cross section of line C-C of the sample stage 11 of FIG. 19. Further, in order to easily recognize the positional relationship, the outer edge of the sample 10, i.e., the wafer of φ300 or the wafer of φ450 is shown by a dotted line.

As shown in FIG. 19(A), the DC power supply 38-1 set as the positive voltage and the DC power supply 38-2 set as the negative voltage are each connected with the disc-shaped electrode 32-1 and the ring-shaped electrode 32-2, respectively, via the switch 36-1 and the switch 36-2 and turn-on the switch 36-1 and the switch 36-2 to attract the sample 10 into the sample stage 11. In this case, similar to the fifth embodiment and the seventh embodiment, the outer edge of the electrode 32-2 is configured to be further protruded than the outer edge of the sample 10 having a first size, i.e., the wafer of φ300. In addition, the DC power supply 38-2 set as the negative voltage is connected with the retarding power supply 26 in series, such that the electrode 32-2 is applied with voltage (negative voltage having a larger absolute value) smaller than the retarding voltage. As a result, the equipotential surface 20-2 is elevated at the outside of the sample 10 through the dielectric part 34 from the electrode 32-2 that is a portion protruded from the sample 10.

In addition, as described in the seventh embodiment, when the distance between the optical axis 18 and the outer edge of the sample 10 is X, the hole radius of the shield electrode 16 is R1, and the amount protruded from the electrode 32-2 is DR1, it is important to set the (DR1+X)/R1 to 1 or more. Therefore, even when the outer peripheral portion of the sample 10 is inspected, the equipotential surface 20-1 (not shown) of the vicinity of the surface of the sample 10 has the axial symmetry distribution based on the optical axis as a center and the bending of the primary electron beam 22 is suppressed to prevent the position deviation.

Next, the configuration when the wafer of φ450 is installed on the sample stage 11 as the sample 10 having a second size will be described with reference to FIG. 19(B). In this case, the polarity of the DC power supply 38-1 and the DC power supply 38-2 connected to the retarding power supply 26 in series are inverted to the case of FIG. 19(A), such that the DC power supply 38-1 is set to a negative voltage and the DC power supply 38-2 is set to the positive voltage. Voltage is applied to the electrode 32-1 and the electrode 32-2, respectively, by turning-on the switch 36-1 and the switch 36-2 connected to each of the power supply and voltage is applied to the ring-shaped electrode 32-3 by turning-on the switch 36-3 connected to the DC power supply 38-1. In this case, the DC power supply 38-1 set as the negative voltage is connected with the retarding power supply 26 in series, such that the electrode 32-3 is applied with voltage (a negative voltage having a larger absolute value) smaller than the retarding voltage. As a result, the equipotential surface 20-2 is elevated at the outside of the sample 10 through the dielectric part 34 from the electrode 32-3 that is a portion protruded from the sample 10. In addition, as described above, it is important to set the (DR1+X)/R1 to 1 or more. In this case, the bending of the primary electron beam 22 can be reduced at the negative voltage of the DC power supply 38-2 having a smaller absolute value.

In addition, the eighth embodiment can suppress the sheet of the electrode installed in the dielectric part 34 to three sheets and can obtain the foregoing effects using a simpler configuration than the seventh embodiment. In addition, after the inspection process, it is important to remove the residual adsorption of the sample 10 into the sample stage 11 after turning-off the switches 36-1 to 36-3. To this end, it is preferable that the areas of each of the positive and negative electrodes opposite to the sample 10 are the same. For this reason, in the eighth embodiment, the positive voltage is applied to the electrode 32-1 and the negative voltage is applied to the electrode 32-2 when the wafer of φ300 as the sample 10 is inspected, while the negative voltage is applied to the electrode 32-1 and the electrode 32-3 and the positive voltage is applied to the electrode 32-2 when the wafer of φ450 as the sample 10 is inspected. Therefore, when the sample 10 having each size is inspected, the areas of each of the positive and negative electrodes opposite to the sample 10 are the same, such that it is possible to remove the residual adsorption into the sample stage 11 for the sample 10 after the inspection process is performed and the switches 36-1 to 36-3 are turned-off.

In detail, the hole radius R1 of the shield electrode 16 is 10 mm, the radius of the electrode 32-1 is a disc of 104 mm, the electrode 32-2 is a ring of inner radius 108 mm and outer radius 189.2 mm, and the electrode 32-3 is a ring of inner radius 193.2 mm and outer radius 234 mm. In this configuration, when the sample 10 is the wafer of φ300, the attracting part in the region of the electrode applied with the positive voltage is a disc of radius 104 mm and the attracting part in the region of the electrode having a negative voltage is a ring having the inner radius 108 mm and the outer radius 150 mm and the area of the attracting part of the positive and negative poles is approximately the same to make the absolute value of the DC power supply 38-1 and the DC power supply 38-2 the same, thereby weakening the residual adsorption force of the sample stage 11 for the sample 10. In addition, for example, when the distance X between the optical axis 18 and the outer edge of the sample 10 is 1 mm, the (DR1+X)/R1 is 1 or more and the bending of the primary electron beam 22 can be reduced at the negative voltage of the DC power supply 38-2 having a smaller absolute value.

In addition, when the sample 10 is the wafer of φ450, the adsorption part in the area of the electrode applied with a positive voltage is a ring of an inner radius 108 mm and an outer radius 189.2 mm. On the other hand, the adsorption part in the region of the electrode applied with the negative voltage is a disc of radius 104 mm and a ring of inner radius 193.2 mm and an outer radius 225 mm. As a result, the areas of the adsorption part of the positive and negative poles are approximately the same to make the absolute value of the voltage of the DC power supply 38-1 and the DC power supply 38-2 the same, thereby making it possible to weaken the residual adsorption force of the sample stage 11 for the sample 10. In addition, for example, when the distance X between the optical axis 18 and the outer edge of the sample 10 is 1 mm, the (DR1+X)/R1 is 1 or more and the bending of the primary electron beam 22 can be reduced at the negative voltage of the DC power supply 38-2 having a smaller absolute value.

Further, in the eighth embodiment, the electrodes 32-1 to 32-3 are formed to have the above mentioned dimension, but are not limited thereto.

In the eighth embodiment, since the electrodes 32-1 to 32-3 are at a position lower than the bottom surface of the sample 10 and is covered with the dielectric part 34, there is no risk of interfering or contacting with the sample 10. As a result, the eighth exemplary embodiment can obtain an effect of preventing the position deviation while effectively installing and attracting the sample 10 on the sample stage 11.

In addition, the first to eighth embodiments install the wafer of φ300 and φ450 as the sample 10 having different sizes on the sample stage 11 but are not limited thereto. As a result, the wafer of φ200 and the wafer of φ300 may be used.

In addition, the first to eighth embodiment describe, for example, the CD-SEM as the inspecting apparatus using the primary electron beam but are not limited thereto. The present invention is applied to other inspecting apparatuses using the primary electron beam, which prevents the bending of the primary electron beam to obtain the effect of removing the position deviation by preventing the bending of the primary electron beam, similar to the present invention.

In addition, the first to eighth embodiment describe, for example, the inspecting apparatus using the primary electron beam as the charged particles but are not limited thereto. For example, the present invention can be applied to a microscope using ions such as helium or lithium, etc. In this case, unlike the first to sixth embodiments, since the charged particles have the positive potential, they have the polarity and value suitable for measuring the retarding potential or the potential correcting electrode applied to the sample to prevent the bending of the charged particles to obtain the effect of removing the position deviation.

In addition, the first to eighth embodiment describe, for example, the inspecting apparatus as a charged particle beam application apparatus, but are not limited thereto. For example, the present invention is applied to the primary electron beam drawing apparatus forming the electron circuit pattern by irradiating the primary electron beam on the wafer applied with the photosensitive material to prevent the bending of the charged particles to obtain the position deviation similar to the present invention.

Industrial Applicability

As described above, the present invention can prevent the bending of the charged particle beam such as the primary electron beam when inspecting the vicinity of the outer edge of the sample, thereby making it possible to remove the position deviation. Further, the present invention obtains the same effect even when inspecting the sample having different size, which may be usefully used for the semiconductor inspecting apparatus.

EXPLANATION OF REFERENCE NUMERALS AND SYMBOLS

1 . . . ELECTRON GUN
2 . . . EXTRACTION ELECTRODE
3 . . . CONDENSER LENS
5 . . . SCANNING DEFLECTOR
6 . . . APERTURE
8 . . . E CROSS B DEFLECTOR
9 . . . OBJECTIVE LENS
10 . . . SAMPLE
11 . . . SAMPLE STAGE
14 . . . SECONDARY ELECTRON DETECTOR
15 . . . X-Y STAGE
16 . . . SHIELD ELECTRODE
18 . . . OPTICAL AXIS
22 . . . PRIMARY ELECTRON BEAM
24 . . . SECONDARY ELECTRON
26 . . . RETARDING POWER SUPPLY
27 . . . ANALYZER
29 . . . CONTROLLER
32 . . . ELECTRODE
34 . . . DIELECTRIC PART
35 . . . METAL BASE
38 . . . DC POWER SUPPLY
40 . . . CONTACT PIN
42 . . . SWITCH
44 . . . POTENTIAL CORRECTING ELECTRODE
46 . . . SWITCH
48 . . . DC POWER SUPPLY
50 . . . GROOVE
52 . . . INSULATOR
54 . . . CONCAVE PORTION

The invention claimed is:

1. A semiconductor inspecting apparatus, the apparatus comprising:
    a sample stage holding a circular sample, a surface of which being made of dielectric;
    a unit moving the sample stage;
    a beam source irradiating a charged particle beam on a surface of the sample;
    a beam scanning unit scanning the charged particle beam on the surface of the sample;
    a first attracting electrode installed within the dielectric;
    a second attracting electrode installed within the dielectric;
    a first attracting voltage supply source installed in order to apply voltage to the first attracting electrode;
    a second attracting voltage supply source having different polarity from that of the first attracting voltage supply source installed in order to apply voltage to the second attracting electrode;

a ring-shaped potential correcting electrode installed at a position lower than a surface holding the sample of the sample stage;

a correction voltage supply source applying voltage to the potential correcting electrode;

an analyzer analyzing the voltage of the correction voltage supply source according to an inspecting position of the sample, a thickness of the sample and an irradiating condition of the charged particle beam; and a controller controlling the voltage of the correction voltage supply source based on an analysis result of the analyzer, wherein an outer edge of the first attracting electrode is at an inside from an inner edge of the second attracting electrode, an inner edge of the second attracting electrode is at an inside of an outer edge of the circular sample, an outer edge of the second attracting electrode is at an inside of the outer edge of the circular sample, an inner side of the potential correcting electrode is at an outside of the outer edge of the second attracting electrode, and an outer side of the potential correcting electrode is at the outside of the outer edge of the circular sample.

2. The semiconductor inspecting apparatus according to claim 1, wherein the potential correcting electrode of the sample stage is formed within the dielectric.

3. The semiconductor inspecting apparatus according to claim 1, wherein the first attracting electrode is formed in a circular shape, the second attracting electrode and the potential correcting electrode are formed in a substantially concentric circle shape with respect to the first attracting electrode.

4. A semiconductor inspecting apparatus, the apparatus comprising:

a sample stage holding a circular sample, a surface of which being made of dielectric;

a unit moving the sample stage;

a beam source irradiating a charged particle beam on a surface of the sample;

a beam scanning unit scanning the charged particle beam on the surface of the sample;

a first attracting electrode installed within the dielectric;

a second attracting electrode installed within the dielectric;

a first attracting voltage supply source installed in order to apply voltage to the first attracting electrode;

a second attracting voltage supply source having different polarity from that of the first attracting voltage supply source installed in order to apply voltage to the second attracting electrode;

an analyzer analyzing the voltages of the first attracting voltage supply source, and the second attracting voltage supply source; and a controller controlling the voltages of the first attracting voltage supply source, and the second attracting voltage supply source based on an analysis result of the analyzer, wherein an outer edge of the first attracting electrode is at an inside from an inner edge of the second attracting electrode, an inner edge of the second attracting electrode is at an inside of an outer edge of the circular sample, an outer edge of the second attracting electrode is at an outside of the outer edge of the circular sample, the second attracting electrode attracts the circular sample to the sample stage, and serves as a potential correcting electrode.

5. The semiconductor inspecting apparatus according to claim 4, further comprising:

an objective lens converging the charged particle beam on the sample; and a shield electrode installed between the objective lens and the sample, which has a hole on an optical axis of the charged particle beam, and is maintained at equipotential to the sample, wherein a sum of at least one of a difference in a radial length between an outer edge of the second electrode and an outer edge of the sample in a first size and a difference in a radial length between an outer edge of a fourth electrode and an outer edge of the sample in a second size and a distance between a measurement position in measuring the outermost portion among measurement positions of the sample and the outer edge of the sample is equal to or larger than a radius of the hole of the shield electrode.

6. A semiconductor inspecting apparatus, the apparatus comprising:

a sample stage holding a sample;

a unit moving the sample stage;

a beam source irradiating a charged particle beam on a surface of the sample;

a beam scanning unit scanning the charged particle beam on the surface of the sample;

a first potential correcting electrode installed at a position lower than a surface holding the sample of the sample stage, and at an outside of an outer edge of the sample;

a first voltage supply source applying voltage to the first potential correcting electrode; and a controller controlling the voltage of the first voltage supply source based on an irradiating position of the charged particle beam to the sample.

7. The semiconductor inspecting apparatus according to claim 6, further comprising:

a retarding power supply source applying a retarding voltage to the sample, wherein the first voltage supply source and the retarding power supply source are electrically connected in series.

8. The semiconductor inspecting apparatus according to claim 6, further comprising:

a second potential correcting electrode installed at a position lower than the surface holding the sample of the sample stage, and at an outside of an outer edge of the first potential correcting electrode; and a second voltage supply source applying voltage to the second potential correcting electrode, wherein the controller controls the voltage of the second voltage supply source based on the irradiating position of the charged particle beam to the sample.

9. The semiconductor inspecting apparatus according to claim 6, further comprising:

a first attracting electrode and a second attracting electrode attracting the sample, being installed within the sample stage.

10. The semiconductor inspecting apparatus according to claim 6, further comprising:

wherein the first potential correcting electrode is a ring-shaped electrode.

11. A semiconductor inspecting apparatus, the apparatus comprising:

a sample stage holding a sample;

a unit moving the sample stage;

a beam source irradiating a charged particle beam on a surface of the sample;

a beam scanning unit scanning the charged particle beam on the surface of the sample; and a first electrode and a second electrode attracting the sample, being installed within the sample stage, wherein the first electrode is installed at an inside of the second electrode, and supplied with a first DC power, an outer edge of the second electrode is installed at an outside of an outer edge of the sample, and the second electrode is supplied with a second DC power having polarity different from the first DC power.

12. The semiconductor inspecting apparatus according to claim 11, further comprising:

a retarding power supply source applying a retarding voltage to the sample; and a voltage supply source applying the second DC power to the second electrode, wherein the voltage supply source and the retarding power supply source are electrically connected in series.

13. The semiconductor inspecting apparatus according to claim 11, further comprising:

an objective lens converging the charged particle beam on the sample;

a deflector deflecting a secondary electron generated from the sample, being installed at a beam source side of the objective lens, and a detector detecting the secondary electron deflected by the deflector, being installed at a beam source side of the deflector.

14. The semiconductor inspecting apparatus according to claim 13, further comprising:

a shield electrode which has a hole passing the charged particle beam, being installed between the objective lens and the sample stage.

15. The semiconductor inspecting apparatus according to claim 14, wherein a sum of a distance X between an inspecting position of the sample and the outer edge of the sample, and a distance DR1 between the outer edge of the second electrode and the outer edge of the sample is larger than a radius of the hole of the shield electrode.

\* \* \* \* \*